(12) United States Patent
Shirao

(10) Patent No.: US 11,948,850 B2
(45) Date of Patent: Apr. 2, 2024

(54) SEMICONDUCTOR MODULE AND METHOD FOR MANUFACTURING SEMICONDUCTOR MODULE

(71) Applicant: Mitsubishi Electric Corporation, Tokyo (JP)

(72) Inventor: Akitoshi Shirao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 17/465,659

(22) Filed: Sep. 2, 2021

(65) Prior Publication Data
US 2022/0173007 A1 Jun. 2, 2022

(30) Foreign Application Priority Data

Nov. 27, 2020 (JP) .................................. 2020-196639

(51) Int. Cl.
*H01L 23/31* (2006.01)
*H01L 21/48* (2006.01)
(Continued)

(52) U.S. Cl.
CPC ...... *H01L 23/3142* (2013.01); *H01L 21/4842* (2013.01); *H01L 21/565* (2013.01);
(Continued)

(58) Field of Classification Search
CPC .......... H01L 23/3142; H01L 23/49562; H01L 23/49575; H01L 21/4842; H01L 21/565; H01L 24/48; H01L 24/49; H01L 25/162
See application file for complete search history.

(56) References Cited

U.S. PATENT DOCUMENTS 6,603,148 B1 * 8/2003 Sano ................... H01L 23/3107
257/E33.059
6,603,197 B1 * 8/2003 Yoshida ................. H01L 24/49
257/676

(Continued)

FOREIGN PATENT DOCUMENTS

JP S62-165348 A 7/1987
JP S63-110763 A 5/1988
(Continued)

OTHER PUBLICATIONS

An Office Action issued by the German Patent and Trademark Office dated Feb. 27, 2023, which corresponds to German Patent Application No. 102021128551.8 and is related to U.S. Appl. No. 17/465,659; with English language translation.
(Continued)

*Primary Examiner* — Marc Anthony Armand
(74) *Attorney, Agent, or Firm* — Studebaker & Brackett PC

(57) ABSTRACT

In one aspect of the semiconductor module, the sealing material on the lower side of the die stage is thinner than the sealing material on the upper side of the semiconductor element, a bent portion that forms a step with respect to vertical direction in the first lead is provided in a region sealed by the sealing material in the first lead, the side where the die stage is present of the step is positioned below the side where the die stage is not present of the step due to the step, the side where the die stage is not present of the step in the first lead protrudes from one end side of the sealing material, and a groove is provided on an upper side surface, a lower side surface, or both of them of the bent portion of the first lead.

37 Claims, 14 Drawing Sheets

(51) Int. Cl.
*H01L 21/56* (2006.01)
*H01L 23/00* (2006.01)
*H01L 23/495* (2006.01)
*H01L 25/16* (2023.01)

(52) U.S. Cl.
CPC .. *H01L 23/49562* (2013.01); *H01L 23/49575* (2013.01); *H01L 24/48* (2013.01); *H01L 24/49* (2013.01); *H01L 25/162* (2013.01); *H01L 2224/48137* (2013.01); *H01L 2224/48245* (2013.01); *H01L 2224/49052* (2013.01); *H01L 2924/182* (2013.01); *H01L 2924/183* (2013.01); *H01L 2924/186* (2013.01)

(56) References Cited

U.S. PATENT DOCUMENTS

| | | |
|---|---|---|
| 2003/0127711 A1 | 7/2003 | Kawai et al. |
| 2005/0116145 A1 | 6/2005 | Aki et al. |
| 2009/0279942 A1* | 11/2009 | Pecar .................. A47B 95/00 403/8 |
| 2017/0004981 A1 | 1/2017 | Sakamoto |

FOREIGN PATENT DOCUMENTS

| | | |
|---|---|---|
| JP | H01-046961 A | 2/1989 |
| JP | H06-085153 A | 3/1994 |
| JP | H06-132458 A | 5/1994 |
| JP | H11-330116 A | 11/1999 |

OTHER PUBLICATIONS

An Office Action; "Notice of Reasons for Refusal," mailed by the Japanese Patent Office dated Jan. 23, 2024, which corresponds to Japanese Patent Application No. 2020-496639 and is related to U.S. Appl. No. 17/465,659; with English language translation.

* cited by examiner

SEMICONDUCTOR MODULE AND METHOD FOR MANUFACTURING SEMICONDUCTOR MODULE

BACKGROUND OF THE INVENTION

Field of the Invention

The present disclosure relates to a semiconductor module and a method for manufacturing a semiconductor module.

Description of the Background Art

In a semiconductor module, a semiconductor element is sealed with a sealing material such as an epoxy resin. A technique for sealing a semiconductor element with a sealing material is disclosed in, for example, Japanese Patent Application Laid-Open No. H11-330116 (1999).

When sealing with a sealing material is performed in a semiconductor module, an unfilled state (void) of the sealing material may occur.

SUMMARY

The present disclosure has an object to provide a semiconductor module capable of suppressing occurrence of an unfilled state of a sealing material at the time of performing sealing with the sealing material, and a method for manufacturing the semiconductor module capable of suppressing occurrence of an unfilled state of the sealing material at the time of performing sealing with the sealing material.

A semiconductor module according to a first aspect of the present disclosure includes a first lead, a second lead, a semiconductor element, and a sealing material that seals a part of the first lead, a part of the second lead, and the semiconductor element. The first lead includes a die stage. The semiconductor element is bonded onto the upper side surface of the die stage. The sealing material on the lower side of the die stage is thinner than the sealing material on the upper side of the semiconductor element. The sealing material on the lower side of the die stage is thinner than the sealing material on the lower side of the second lead. A bent portion that forms a step with respect to vertical direction on the first lead is provided in a region sealed with the sealing material in the first lead. Due to the step, the side on which the die stage is present of the step is positioned below the side on which the die stage is not present of the step. A side on which the die stage is not present of the step of the first lead protrudes from one end side of the sealing material. The second lead protrudes from the side opposite to the one end side of the sealing material. A groove is provided on the upper side surface, the lower side surface, or both of them of the bent portion of the first lead. With the above configuration, it is possible to suppress occurrence of an unfilled state of the sealing material at the time of performing sealing with the sealing material.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

In the following description, "upper" and "lower" respectively refer to one direction of the semiconductor module as an upper direction and the opposite direction as a lower direction, and do not limit the upper and lower directions when the semiconductor module is manufactured or used.

A. First Preferred Embodiment

A-1. Configuration

Figure 1:
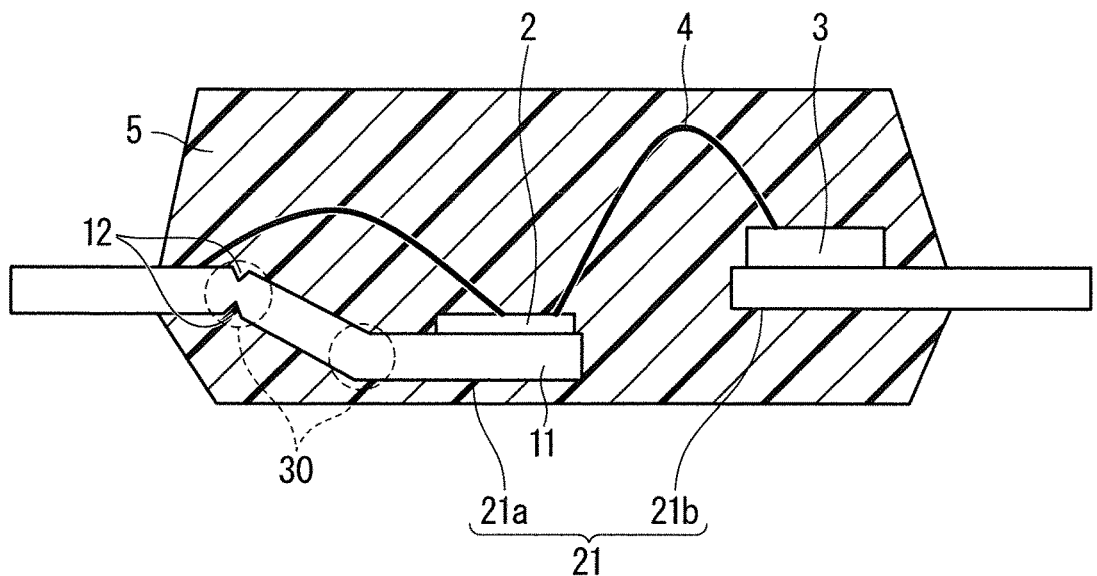
FIG. 1 is a schematic cross-sectional view of a semiconductor module according to a first preferred embodiment.

FIG. 1 is a schematic cross-sectional view of a semiconductor module 101 according to a first preferred embodiment.

The semiconductor module 101 is, for example, a power module for power supply.

As illustrated in FIG. 1, the semiconductor module 101 includes a lead frame 21, a semiconductor element 2, a driving integrated circuit (IC) 3, a metal wire 4, and a sealing material 5.

The lead frame 21 includes a lead 21a (first lead) and a lead 21b (second lead). The lead 21a and the lead 21b are independent of each other and are not connected.

The semiconductor element 2 is bonded to the lead 21a using a bonding material such as solder or sintered Ag. In the present disclosure, a portion on which the semiconductor element is mounted in the lead frame is particularly expressed as a die stage. The lead 21a includes a die stage 11, and the semiconductor element 2 is bonded onto the upper side surface of the die stage 11 of the lead 21a. The semiconductor element 2 is, for example, any one of a diode, a metal-oxide-semiconductor field-effect transistor (MOS-FET), an insulated-gate bipolar transistor (IGBT), and a reverse conducting IGBT (RC-IGBT).

The driving IC 3 is bonded onto the upper side surface of the lead 21b. The driving IC 3 is for driving and controlling the semiconductor module 101, for example.

The lead 21a, the lead 21b, the semiconductor element 2, the driving IC 3, and the like are electrically wired with the metal wire 4 as necessary. In addition, part of the lead 21a, part of the lead 21b, the semiconductor element 2, and the driving IC 3 are sealed with a sealing material 5. Thus, the semiconductor element 2, the driving IC 3, and the metal wire 4 are protected. The sealing material 5 is, for example, an epoxy resin.

The sealing material 5 on the lower side of the die stage 11 on which the semiconductor element 2 is mounted is thinner than the sealing material 5 on the lower side of the lead 21b on which the driving IC 3 is mounted. In addition, the sealing material 5 on the lower side of the die stage 11 is thinner than the sealing material 5 on the upper side of the semiconductor element 2.

The sealing material 5 on the lower side of the die stage 11 is important in both functions of insulating properties and heat dissipation properties, and when an unfilled state (void) of the sealing material 5 occurs, the performance of the semiconductor module 101 greatly drops. Therefore, it is desirable to suppress occurrence of an unfilled state of the sealing material 5.

In addition, the thickness of the sealing material 5 on the lower side of the die stage 11 is required to be small from the viewpoint of heat dissipation design. The thickness of the sealing material 5 on the lower side of the die stage 11 is, for example, 0.5 mm or less.

A bent portion 30 that forms a step with respect to vertical direction on the lead 21a is provided in a region sealed by the sealing material 5 in the lead 21a. The die stage 11 is positioned on one side of two regions of the lead 21a divided by the step. Due to the step, the side on which the die stage 11 is present of the step is positioned below the side on which the die stage is not present of the step. However, this is not limited to the case where, in the lead 21a, the whole of the side on which the die stage is not present of the step is positioned above the side on which the die stage 11 is present. For example, the side on which the die stage is not present of the step may have a portion positioned below the side on which the die stage 11 is present by being bent again at a position exposed from the sealing material 5, for example.

A groove 12 is provided on an upper side surface, a lower side surface, or both of them of the bent portion 30 of the lead 21a. The groove 12 is provided at a portion sealed with the sealing material 5 in the lead 21a.

The bent portions 30 are provided at two positions on a side closer to the die stage 11 and a side farther from the die stage 11.

The groove 12 is provided on the upper side surface, the lower side surface, or both of them of the bent portion 30 on the side farther from the die stage 11. FIG. 1 shows a case where the groove 12 is provided on both of the upper side surface and the lower side surface of the bent portion 30 on the side farther from the die stage 11. The groove 12 is not provided on the surface of the bent portion 30 on the side closer to the die stage 11.

The groove 12 is provided so as to extend in a direction intersecting the bending direction of the bent portion 30. The bending direction of the bent portion 30 is a direction in which the curvature is the largest in the bent portion 30. The direction intersecting the bending direction of the bent portion 30 is, for example, a direction perpendicular to the paper surface in FIG. 1.

The depth of the groove 12 is desirably designed so that the cross-sectional area of the lead 21a does not become too small in consideration of the density of the current flowing through the lead 21a.

In the lead 21a, a side on which the die stage 11 is not present of the step formed by the bent portions 30 protrudes from one end side of the sealing material 5. In addition, the lead 21b protrudes from a side opposite to the one end side of the sealing material 5. In FIG. 1, portions protruding from the sealing material 5 of the leads 21a and 21b are flat, but the leads 21a and 21b may be bent at the portions protruding from the sealing material 5.

A-2. Manufacturing Method

In the method for manufacturing a semiconductor module according to the present preferred embodiment, a molding die 6 including a cope 61 and a drag 62 (see FIG. 3) is used, the sealing material 5 is injected into a cavity 63 of the molding die 6, and a part of the lead frame 21, the semiconductor element 2, the driving IC 3, and the metal wire 4 are sealed by the transfer molding method.

Figure 2:
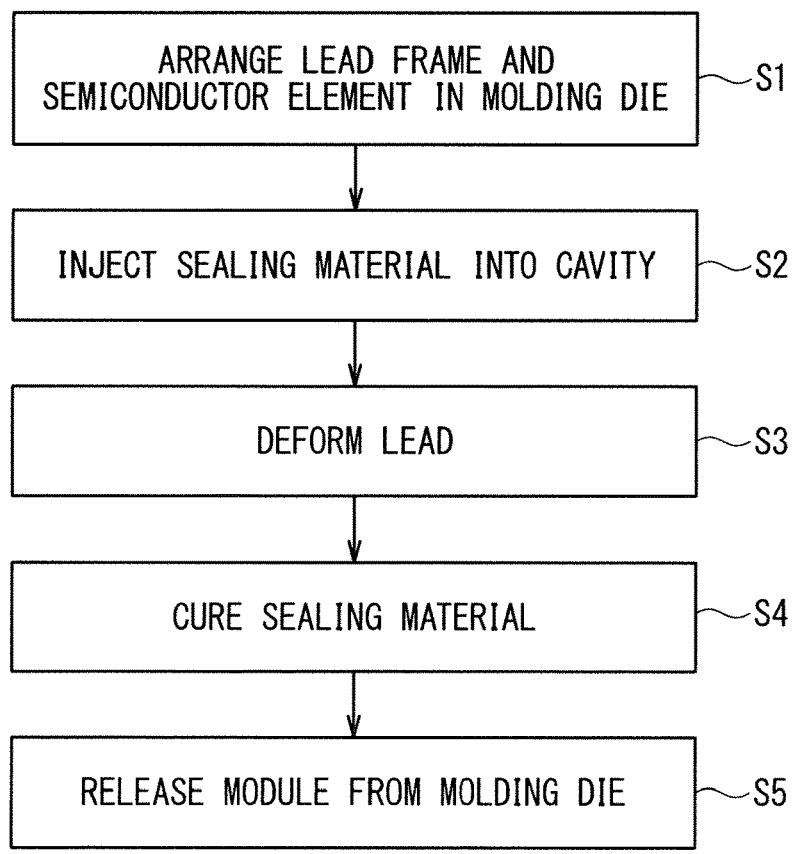
FIG. 2 is a flowchart showing a method for manufacturing the semiconductor module of the first preferred embodiment.

FIG. 2 is a flowchart showing a method for manufacturing the semiconductor module 101.

Figure 3:
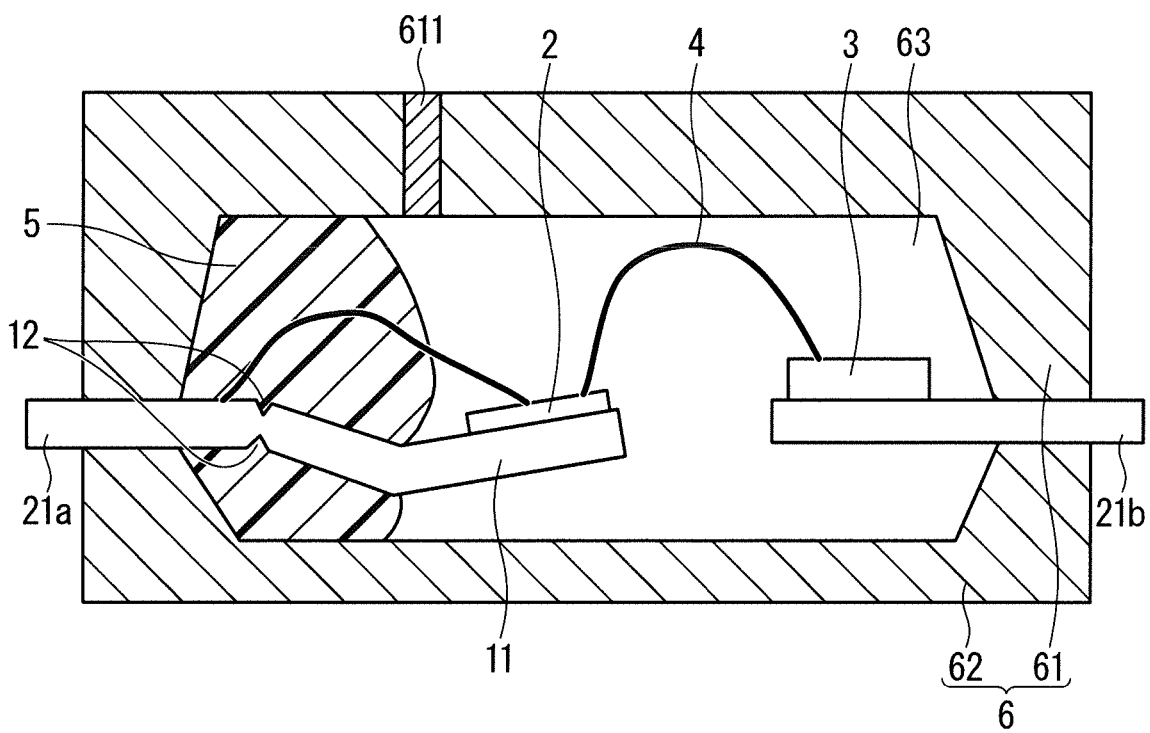
FIGS. 3 to 5 are schematic cross-sectional views each showing a state in the process of manufacturing the semiconductor module of the first preferred embodiment.
Figure 4:
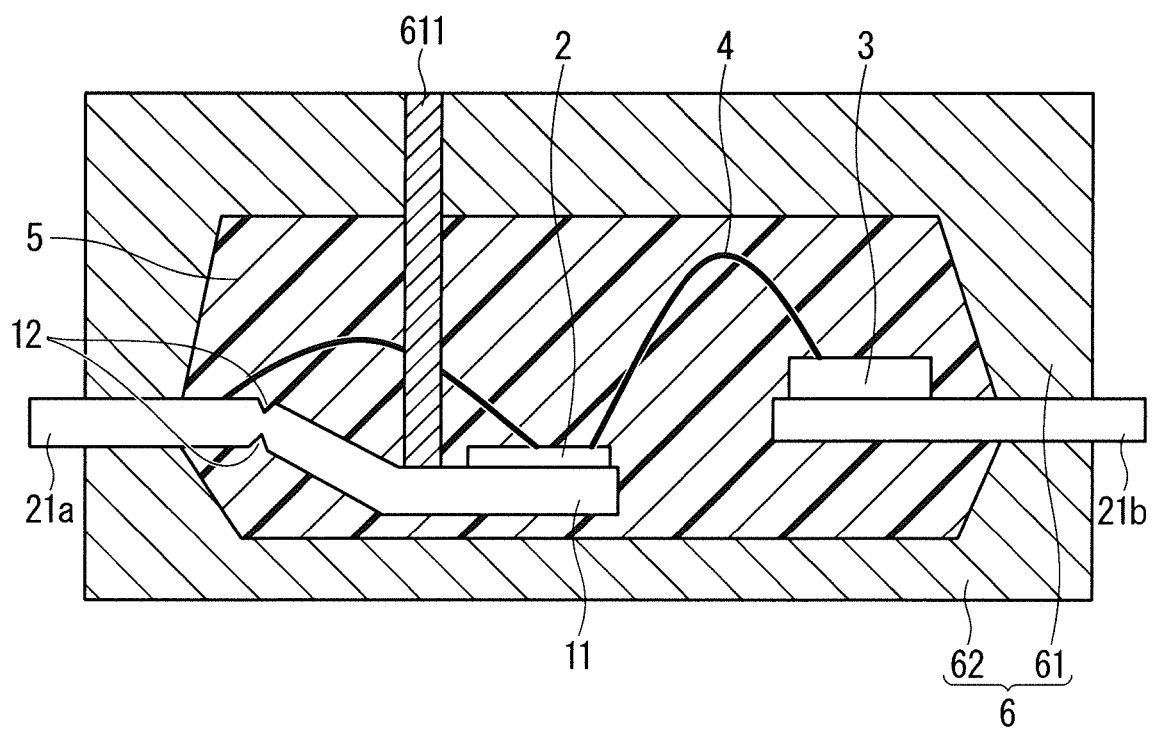
Figure 5:
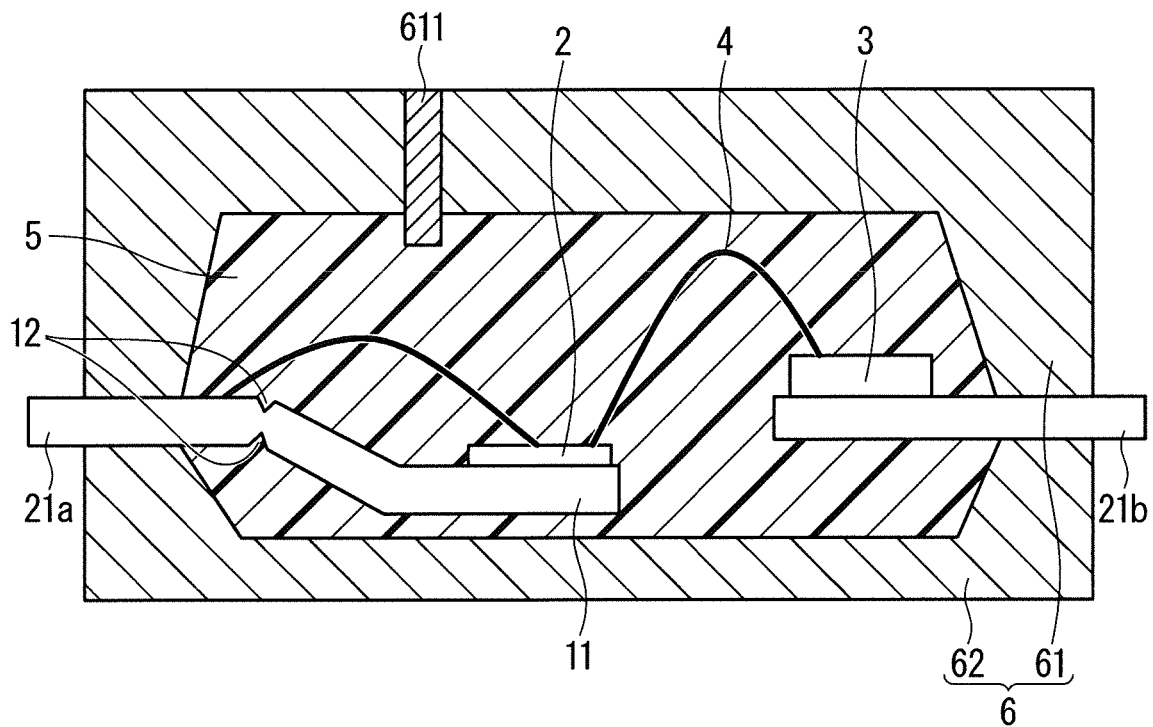

FIGS. 3 to 5 are diagrams showing a method for manufacturing the semiconductor module 101.

First, the lead frame 21, the semiconductor element 2, the driving IC 3, and the metal wire 4 are arranged in the molding die 6 (step S1). Before being arranged in the molding die 6, the semiconductor element 2 is bonded to the lead 21a, the driving IC 3 is bonded to the lead 21b, and wiring is performed with the metal wire 4.

In general, one end side and the other end side of the lead frame are connected outside the molding die. One end side and the other end side of the lead frame are separated by a processing step after being sealed with a sealing material to form external leads. In step S1, the lead 21a on one end side and the lead 21b on the other end side of the lead frame 21 sandwiched by the molding die 6 may be independent of each other and do not need to be connected to each other. In that case, the lead 21a and the lead 21b are sandwiched by the molding die 6 each in a cantilevered state. The lead 21a is supported by the molding die 6 so that the die stage 11 is positioned inside the cavity 63.

Next, as shown in FIG. 3, the sealing material 5 is injected into the cavity 63 of the molding die 6 (step S2).

Before injection of the sealing material 5, the die stage 11 is arranged, for example, at the same position as the position at the time of completion. In this case, when the sealing material 5 is injected from the lead 21a side, by the injection of the sealing material 5, the die stage 11 is lifted upward with the side (that is, the side farther from the die stage 11) where the groove 12 is inserted among the two bent portions 30 as a starting point, and comes to have an inclination. Since the die stage 11 is lifted upward, the flow area of the sealing material 5 on the lower side of the die stage 11 is increased, and the risk of occurrence of an unfilled state can be reduced. Since the metal wire 4 is also lifted up together with the die stage 11, it is necessary to pay attention to wiring the metal wire 4 so that the metal wire 4 does not come into contact with the cope 61 of the molding die 6. In addition, there is a limit to the angle at which the die stage 11 can be inclined so that the die stage 11 or the metal wire 4 does not come into contact with the cope 61 of the molding die 6.

The position of the die stage 11 before injection of the sealing material 5 may be positioned above the position at the time of completion. Also in this case, it is possible to secure a large flow area of the sealing material 5 on the lower side of the die stage 11 in step S2, and it is possible to reduce the risk of occurrence of an unfilled state of the sealing material 5.

After the injection of the sealing material 5 is completed, the lead 21*a* is deformed (step S3).

In step S3, first, as shown in FIG. 4, a cope movable pin 611 provided in the cope 61 of the molding die 6 is lowered, and the die stage 11 is pushed down by the cope movable pin 611 and is adjusted so as to be parallel to the bottom surface of the cavity 63. Here, the bottom surface of the cavity 63 is a surface of the drag 62 facing the die stage 11. In step S3, the lead 21*a* is deformed by application of an external force from the cope movable pin 611. Due to the groove 12 provided in the bent portion 30, pushing down the die stage 11 deforms a portion where the groove 12 is provided. In addition, the groove 12 suppresses deformation at a portion other than the portion where the groove 12 is provided.

Subsequently, in step S3, the cope movable pin 611 is raised as shown in FIG. 5. The cope movable pin 611 may be raised completely, or may be stopped in a state where a part thereof protrudes inside the cavity 63 as shown in FIG. 5.

Since after the cope movable pin 611 is raised, an uncured (molten state) sealing material 5 flows into the position where the cope movable pin 611 has been, the die stage 11 can be sealed so as not to be exposed. Similarly, the uncured sealing material 5 also flows into the movement path of the die stage 11 when the lead 21*a* is deformed, so that an unfilled state does not occur.

Due to the groove 12 provided in the bent portion 30, the die stage 11 holds the position pushed down and adjusted by the cope movable pin 611 with little spring back. However, a spring back slightly occurs. Therefore, in consideration of this, when the die stage 11 is pushed down by the cope movable pin 611, the die stage 11 has only to be slightly inclined downward from the direction parallel to the bottom surface of the cavity 63. Here, the state in which the die stage 11 is inclined downward is a state in which the side farther from the bent portion 30 of the die stage 11 is inclined so as to be positioned further below.

Next, the sealing material 5 is cured (step S4).

Next, the semiconductor module 101 is released from the molding die 6 (step S5).

The semiconductor module 101 is obtained through the above steps.

As described above, a method for manufacturing a semiconductor module according to the present preferred embodiment includes sealing the die stage 11 and the semiconductor element 2. The sealing includes injecting the sealing material 5 into the cavity 63 of the molding die 6. The sealing includes supporting the lead 21*a* by the molding die 6 so that the die stage 11 is positioned inside the cavity 63. The sealing includes, after the sealing material 5 is at least partially injected into the cavity 63, deforming a portion positioned inside the cavity 63 in the lead 21*a* to move the die stage 11 downward and then cure the sealing material 5. In step S3, the die stage 11 moves downward due to the deformation of the lead 21*a*, whereby the thickness of the sealing material 5 on the lower side of the die stage 11 is, for example, half or less of the thickness of the sealing material 5 on the lower side of the die stage 11 when the lead 21*a* is not deformed.

According to the method for manufacturing a semiconductor module of the present preferred embodiment, even if the sealing material 5 on the lower side of the die stage 11 is designed to be thin, for example, on the order of several tens of micrometers, since the flow area under the die stage 11 is large in the process of injecting the sealing material 5 in step S2, the risk of occurrence of an unfilled state of the sealing material 5 can be reduced. The thin sealing material 5 under the die stage 11 contributes to miniaturization of the semiconductor module 101.

In addition, in the method for manufacturing a semiconductor module according to the present preferred embodiment, after the sealing material 5 is injected, applying an external force to a portion positioned inside the cavity 63 in the lead 21*a* by the cope movable pin 611 deforms the lead 21*a*, whereby the position of the die stage 11 can be controlled. Therefore, even if the position of the die stage 11 fluctuates due to flow resistance in the process of injecting the sealing material 5, it is possible to suppress nonuniformity of the thickness of the sealing material 5 on the lower side of the die stage 11 associated with the fluctuation of the position of the die stage 11. In the present preferred embodiment, in step S3, the cope movable pin 611 inserted into the cavity 63 applies an external force to the lead 21*a* to deform the lead 21*a*, but an object other than the cope movable pin 611 may be used in order to apply an external force by an object other than the sealing material 5 to the lead 21*a*.

A-3. Effect

In the semiconductor module 101, the sealing material 5 on the lower side of the die stage 11 is thinner than the sealing material 5 on the upper side of the semiconductor element 2, the sealing material 5 on the lower side of the die stage 11 is thinner than the sealing material 5 on the lower side of the lead 21*b*, a bent portion 30 that forms a step with respect to vertical direction in the lead 21*a* is provided in a region sealed by the sealing material 5 in the lead 21*a*, the side where the die stage 11 is present of the step is positioned below the side where the die stage 11 is not present of the step due to the step, the side where the die stage 11 is not present of the step in the lead 21*a* protrudes from one end side of the sealing material 5, the lead 21*b* protrudes from the side opposite to the one end side of the sealing material 5, and a groove 12 is provided on an upper side surface, a lower side surface, or both of them of the bent portion 30 of the lead 21*a*. This makes it possible to suppress occurrence of an unfilled state of the sealing material 5 when sealing is performed with the sealing material 5.

In the semiconductor module 101, the groove 12 is provided on the upper side surface, the lower side surface, or both of them of the bent portion 30 on the side farther from the die stage 11. This makes it possible to suppress occurrence of an unfilled state of the sealing material 5 when sealing is performed with the sealing material 5.

In the method for manufacturing a semiconductor module according to the present preferred embodiment, after the sealing material 5 is at least partially injected into the cavity 63, a portion positioned inside the cavity 63 in the lead 21*a* is deformed, the die stage 11 moves downward, and then the sealing material 5 is cured. This makes it possible to suppress occurrence of an unfilled state of the sealing material 5 when sealing is performed with the sealing material 5.

In the method for manufacturing a semiconductor module according to the present preferred embodiment, the die stage 11 moves downward due to the deformation of the lead 21a, whereby the thickness of the sealing material 5 on the lower side of the die stage 11 is, for example, half or less of the thickness of the sealing material 5 on the lower side of the die stage 11 when the lead 21a is not deformed. This makes it possible to suppress occurrence of an unfilled state of the sealing material 5 when sealing is performed with the sealing material 5.

In the method for manufacturing a semiconductor module according to the present preferred embodiment, deformation of the lead 21a occurs when an external force is applied to a portion positioned inside the cavity 63 in the lead 21a by the cope movable pin 611 inserted into the cavity 63. Thus, the position of the die stage 11 can be controlled, and for example, in the process of injecting the sealing material 5, it is possible to suppress nonuniformity of the thickness of the sealing material 5 on the lower side of the die stage 11 associated with the fluctuation in the position of the die stage 11.

B. Second Preferred Embodiment

B-1. Configuration

Figure 6:
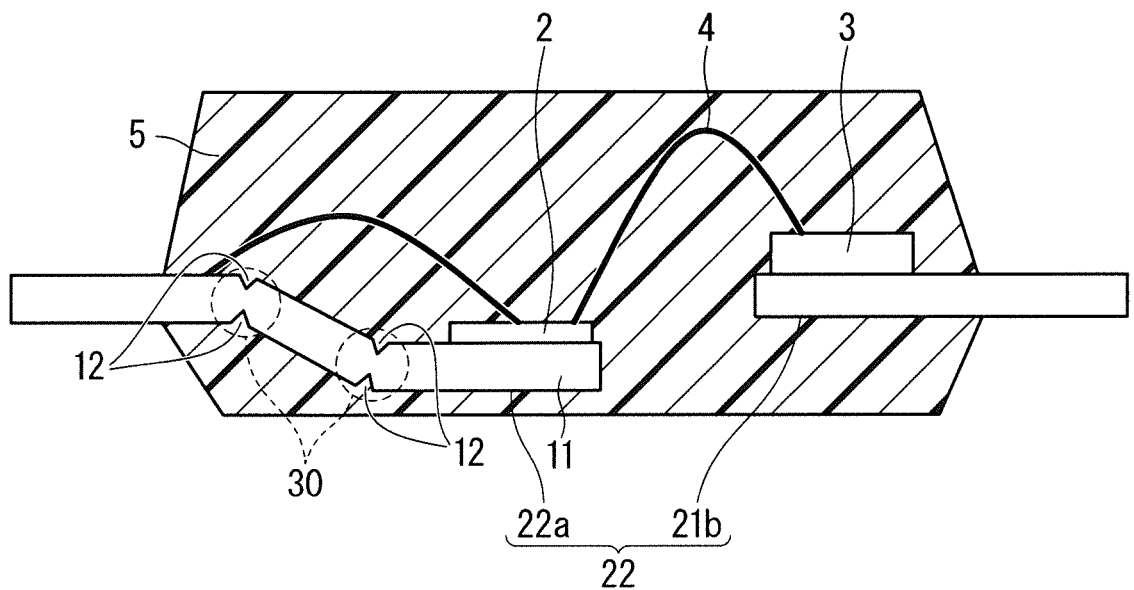
FIG. 6 is a schematic cross-sectional view of a semiconductor module according to a second preferred embodiment.

FIG. 6 is a schematic cross-sectional view of a semiconductor module 102 according to a second preferred embodiment.

The semiconductor module 102 is different from the semiconductor module 101 in that a lead frame 22 is included instead of the lead frame 21. The semiconductor module 102 is similar to the semiconductor module 101 in other points.

The lead frame 22 is different from the lead frame 21 in that a lead 22a is included instead of the lead 21a. The lead frame 22 is similar to the lead frame 21 in other points.

In each of the two bent portions 30 of the lead 22a, the groove 12 is provided on the upper side surface, the lower side surface, or both of them of the lead 22a. The lead 22a is similar to the lead 21a in other points. Each of the grooves 12 of the two bent portions 30 is provided so as to extend in a direction intersecting the bending direction of the bent portion 30. In each of the two bent portions 30 of the lead 22a, the groove 12 is provided on the upper side surface, the lower side surface, or both of them of the lead 22a, whereby in the manufacturing step, the degree of freedom of the shape of the lead 22a before the sealing material 5 is injected into the cavity 63 is increased. For example, as in a manufacturing method described in <B-2. Manufacturing method>, the shape of the lead 22a before the sealing material 5 is injected into the cavity 63 may be flat.

In the two bent portions 30, how the groove 12 is provided may be different. For example, the groove 12 is provided on the upper side surface of the lead 22a in one bent portion 30, and is provided on the lower side surface of the lead 22a in the other bent portion 30.

B-2. Manufacturing Method

FIG. 2 is a flowchart showing a method for manufacturing the semiconductor module 102.

Figure 7:
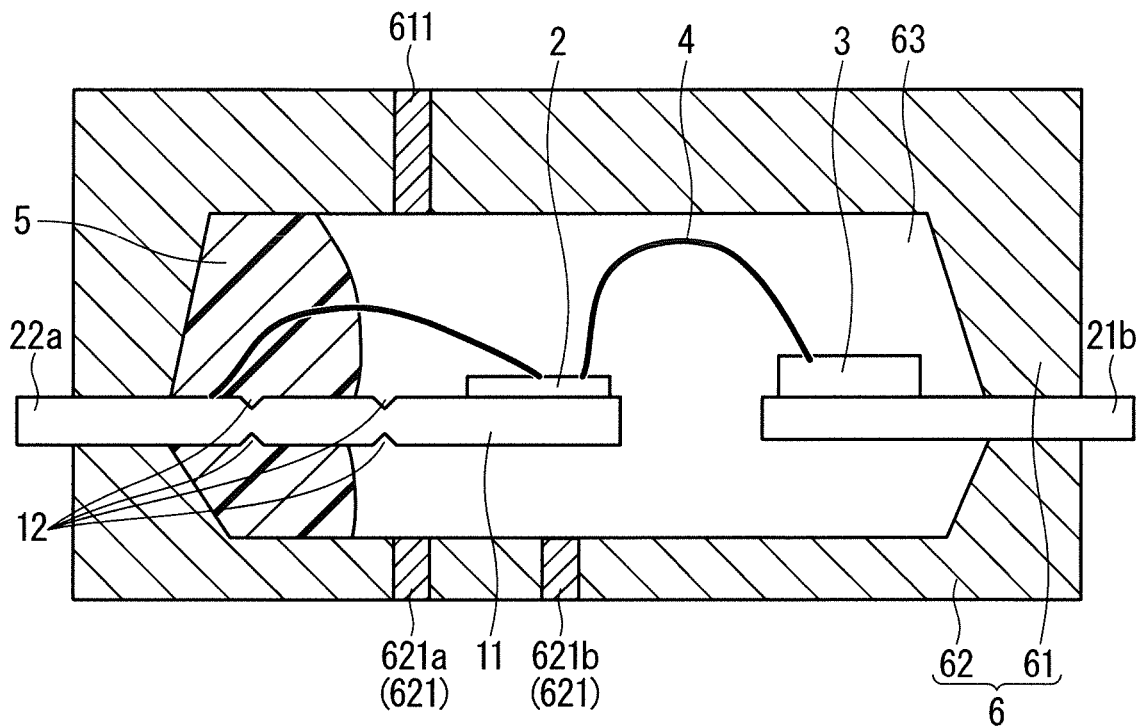
FIGS. 7 to 9 are schematic cross-sectional views each showing a state in the process of manufacturing the semiconductor module of the second preferred embodiment.
Figure 8:
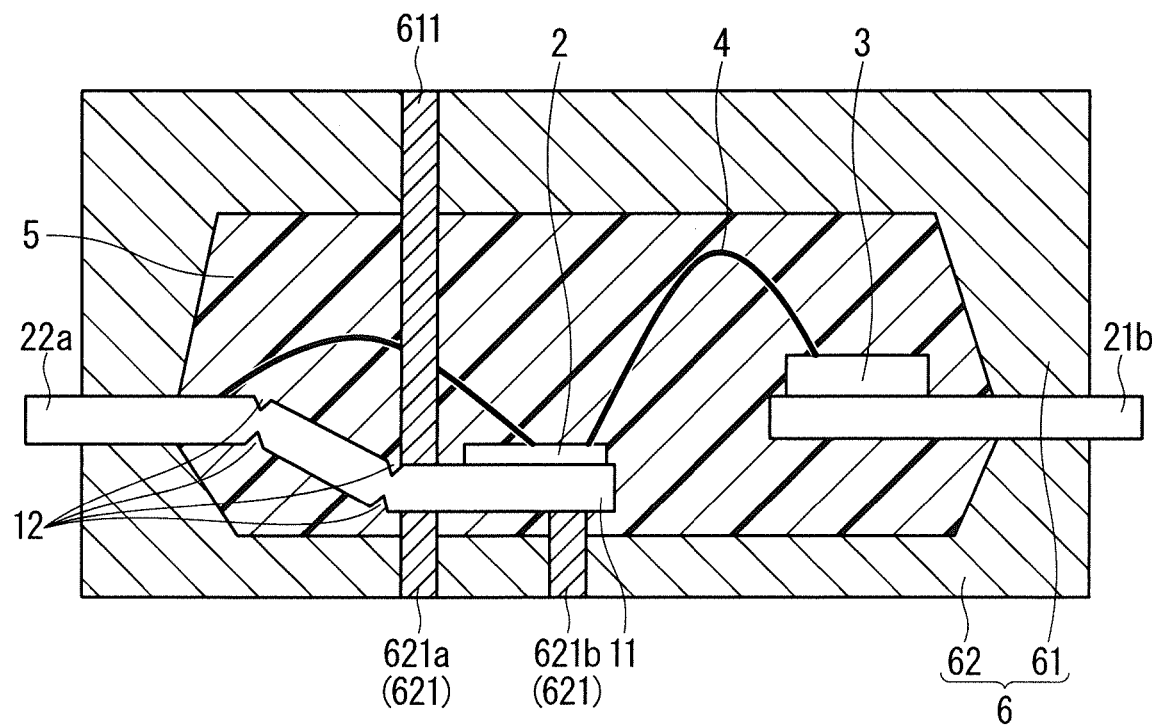
Figure 9:
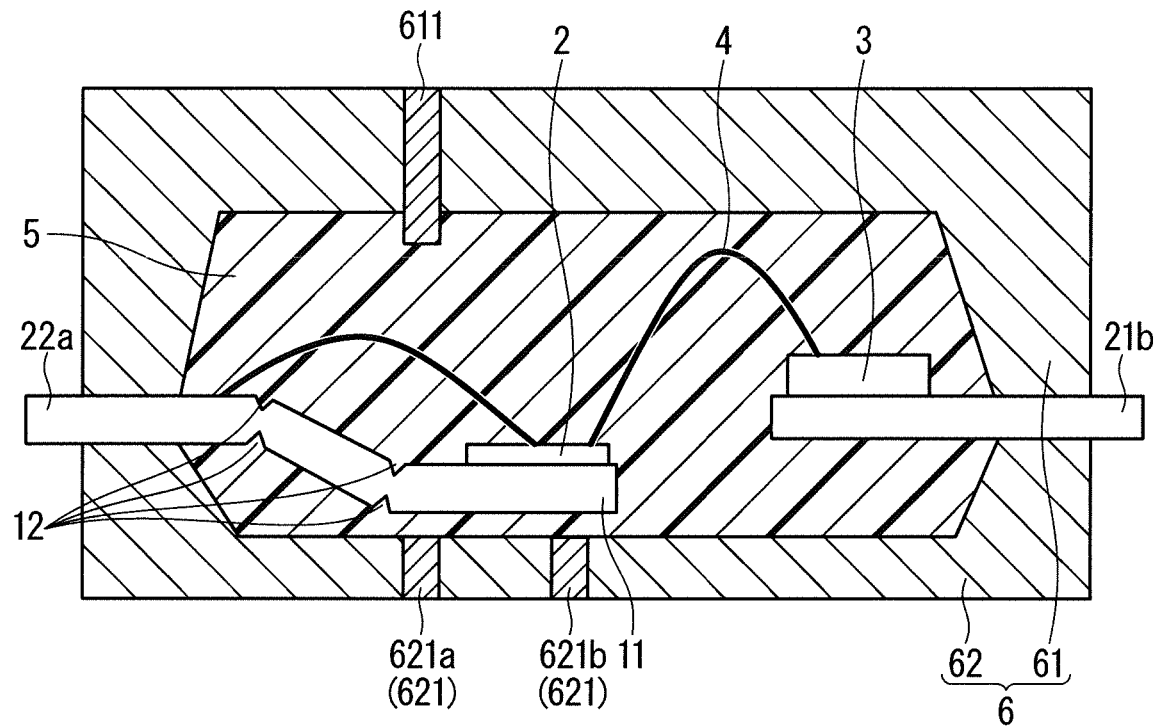

FIGS. 7 to 9 are diagrams showing a method for manufacturing the semiconductor module 102.

First, the lead frame 22, the semiconductor element 2, the driving IC 3, and the metal wire 4 are arranged in the molding die 6 (step S1).

In a stage in step S1, the lead 22a sandwiched by the molding die 6 is flat from the portion outside the cavity 63 to the die stage 11. In particular, a portion positioned inside the cavity 63 in the lead 22a is flat. The state in which the lead 22a is flat includes a case where there is unevenness, a step, or the like whose height is half or less of the thickness of the lead 22a.

Since the lead 22a is flat, the cope 61 of the molding die 6 and the die stage 11 are close to each other, so that it is necessary to pay attention to wiring the metal wire 4 so that the metal wire 4 does not come into contact with the cope 61 of the molding die 6.

Next, as shown in FIG. 7, the sealing material 5 is injected into the cavity 63 of the molding die 6 (step S2).

Since the lead 22a is flat, it is possible to secure a large flow area of the sealing material 5 on the lower side of the die stage 11, and it is possible to reduce the risk of occurrence of an unfilled state of the sealing material 5.

After the injection of the sealing material 5 is completed, the lead 22a is deformed (step S3).

In step S3, as shown in FIG. 8, the cope movable pin 611 provided in the cope 61 of the molding die 6 is lowered, and the die stage 11 is pushed down by the cope movable pin 611. In addition, a drag movable pin 621 provided in the drag 62 is raised, the die stage 11 is sandwiched from above and below by the cope movable pin 611 and the drag movable pin 621, and the die stage 11 is adjusted to be parallel to the bottom surface of the cavity 63. Thus, in the present preferred embodiment, the two bent portions 30 are formed using the cope movable pin 611 and the drag movable pin 621.

In step S3, for example, a plurality of drag movable pins 621 are used. As shown in FIG. 8, for example, the plurality of drag movable pins 621 include a drag movable pin 621a as the drag movable pin 621 and a drag movable pin 621b as the drag movable pin 621. As compared with the drag movable pin 621b, the drag movable pin 621a is arranged closer to the position where the bent portion 30 is formed. The cope movable pin 611 is arranged, for example, at a position overlapping with the drag movable pin 621a in a plan view. A plurality of cope movable pins 611, a plurality of drag movable pins 621a, and a plurality of drag movable pins 621b may be provided. In this case, the plurality of cope movable pins 611, the plurality of drag movable pins 621a, and the plurality of drag movable pins 621b may be arranged side by side in a direction perpendicular to the cross section shown in FIG. 8.

Using the drag movable pin 621 allows the thickness of the sealing material 5 on the lower side of the die stage 11 to be controlled with high accuracy. Even when the lead 22a in which the groove 12 is provided on the upper side surface, the lower side surface, or both of them at each of the two portions where the bent portion 30 is formed is used, using the plurality of drag movable pins 621 including the drag movable pin 621a and the drag movable pin 621b facilitates adjustment of the orientation of the die stage 11 and adjustment of the thickness of the sealing material 5 on the lower side of the die stage 11.

Since the metal wire 4 is also deformed along with the deformation of the die stage 11, it is desirable to increase the wiring height of the metal wire 4 before step S3 so as to have a margin for the deformation.

After the lead 22a is deformed, as shown in FIG. 9, the cope movable pin 611 is raised, and the drag movable pin 621 is lowered. The cope movable pin 611 may be raised completely, or may be stopped in a state where a part of the cope movable pin 611 protrudes inside the cavity 63. On the other hand, the drag movable pin 621 is completely lowered, so that the drag movable pin 621 is in a state of not protruding inside the cavity 63.

After the cope movable pin 611 is raised and the drag movable pin 621 is lowered, the die stage 11 holds the position adjusted by the cope movable pin 611 and the drag movable pin 621 with little spring back due to the groove 12 provided in the bent portion 30. However, although spring back slightly occurs, in consideration of this, adjustment is preferably performed using the cope movable pin 611 and the drag movable pin 621 so that the die stage 11 is slightly inclined upward or downward from the direction parallel to the bottom surface of the cavity 63.

Next, the sealing material 5 is cured (step S4).

Next, the semiconductor module 102 is released from the molding die 6 (step S5).

The semiconductor module 102 is obtained through the above steps.

In the method for manufacturing a semiconductor module according to the present preferred embodiment, in the process of injecting the sealing material 5, the lead frame 22 sandwiched by the molding die 6 is flat up to the die stage 11. Therefore, processing in the process of die bonding and wiring is easier, and the flow area of the sealing material 5 on the lower side of the die stage 11 can be made larger than that of the first preferred embodiment, and the risk of occurrence of an unfilled state can be further reduced.

B-3. Effect

In the semiconductor module 102, the groove 12 is provided on the upper side surface, the lower side surface, or both of them in each of the two bent portions 30 of the lead 22a. This increases the degree of freedom of the shape of the lead 22a before injection of the sealing material 5.

In the method for manufacturing a semiconductor module according to the present preferred embodiment, in the sealing, the lead 22a is flat before the sealing material 5 is injected into the cavity 63. Thus, processing in the process of die bonding and wiring is easier, and the risk of occurrence of an unfilled state can be further reduced.

C. Third Preferred Embodiment

C-1. Configuration

Figure 10:
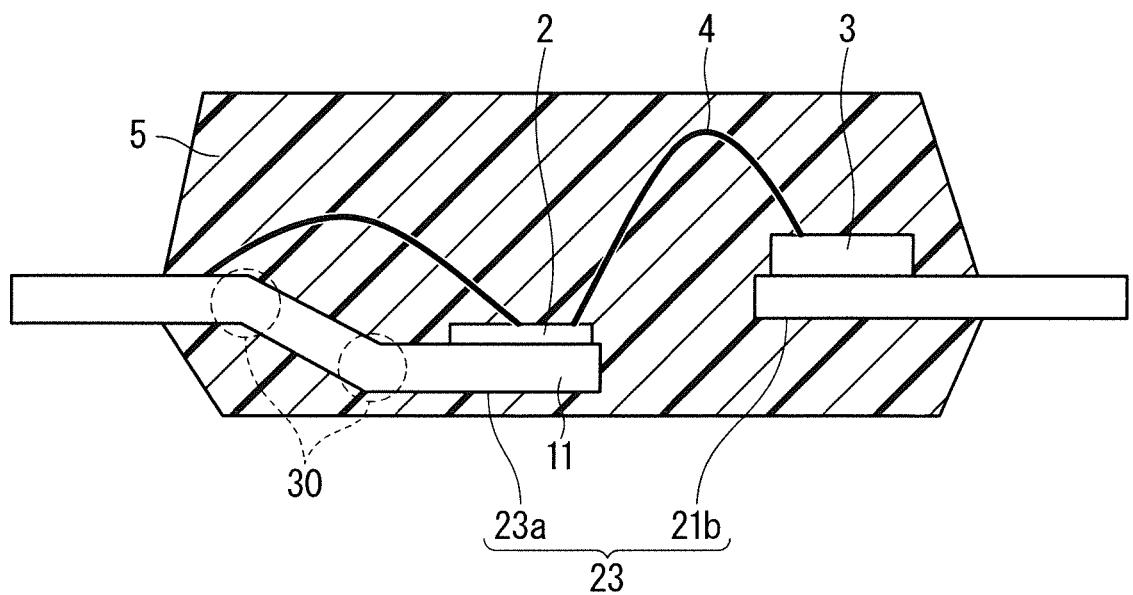
FIG. 10 is a schematic cross-sectional view of a semiconductor module according to a third preferred embodiment.

FIG. 10 is a schematic cross-sectional view of a semiconductor module 103 according to a third preferred embodiment.

The semiconductor module 103 is different from the semiconductor module 101 in that a lead frame 23 is included instead of the lead frame 21. The semiconductor module 103 is similar to the semiconductor module 101 in other points.

The lead frame 23 is different from the lead frame 21 in that a lead 23a is included instead of the lead 21a. The lead frame 23 is similar to the lead frame 21 in other points.

The material of the lead 23a is a shape memory alloy. The shape memory alloy of the material of the lead 23a is, for example, a copper-zinc-based alloy.

In the lead 23a, similarly to the lead 21a, bent portions 30 forming a step are provided at two portions on a side closer to the die stage 11 and a side farther from the die stage 11. In the lead 23a, the two bent portions 30 are not provided with grooves. The shape of the lead 23a is similar to the shape of the lead 21a except that no groove is provided on the surface.

Each of the two bent portions 30 of the lead 23a contains a shape memory alloy. In addition, the lead 23a contains a shape memory alloy in a portion other than the bent portion 30. The lead 23a is entirely made of, for example, a shape memory alloy.

C-2. Manufacturing Method

FIG. 2 is a flowchart showing a method for manufacturing the semiconductor module 103.

Figure 11:
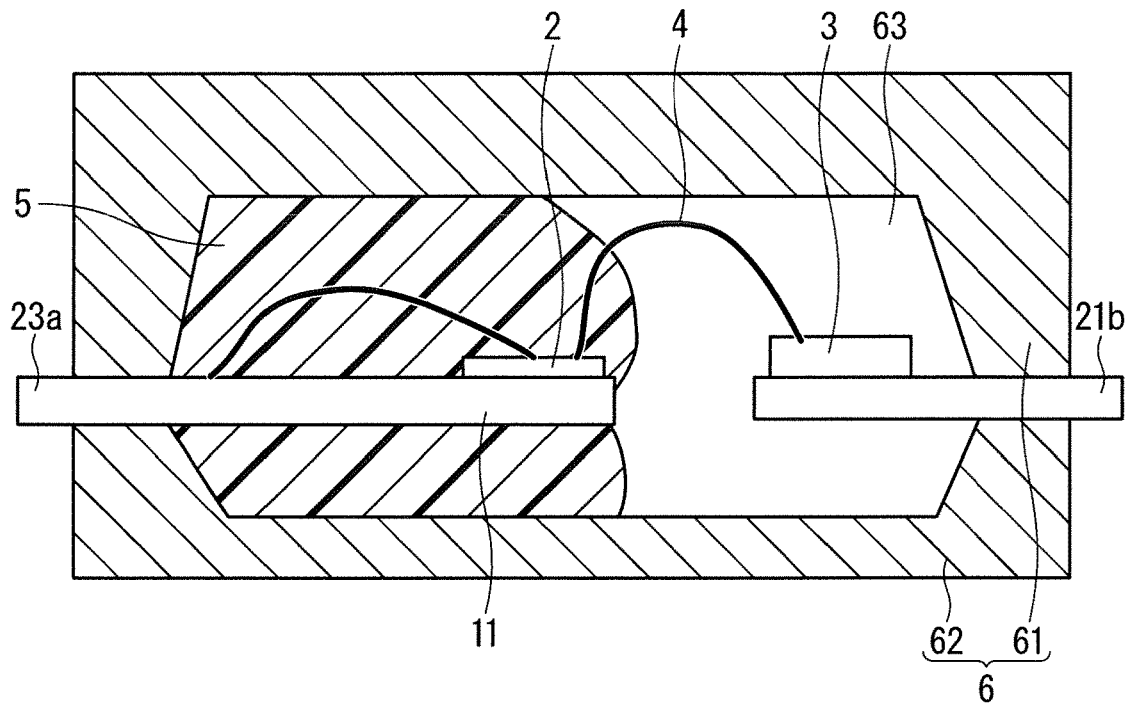
FIGS. 11 to 13 are schematic cross-sectional views each showing a state in the process of manufacturing the semiconductor module of the third preferred embodiment.
Figure 12:
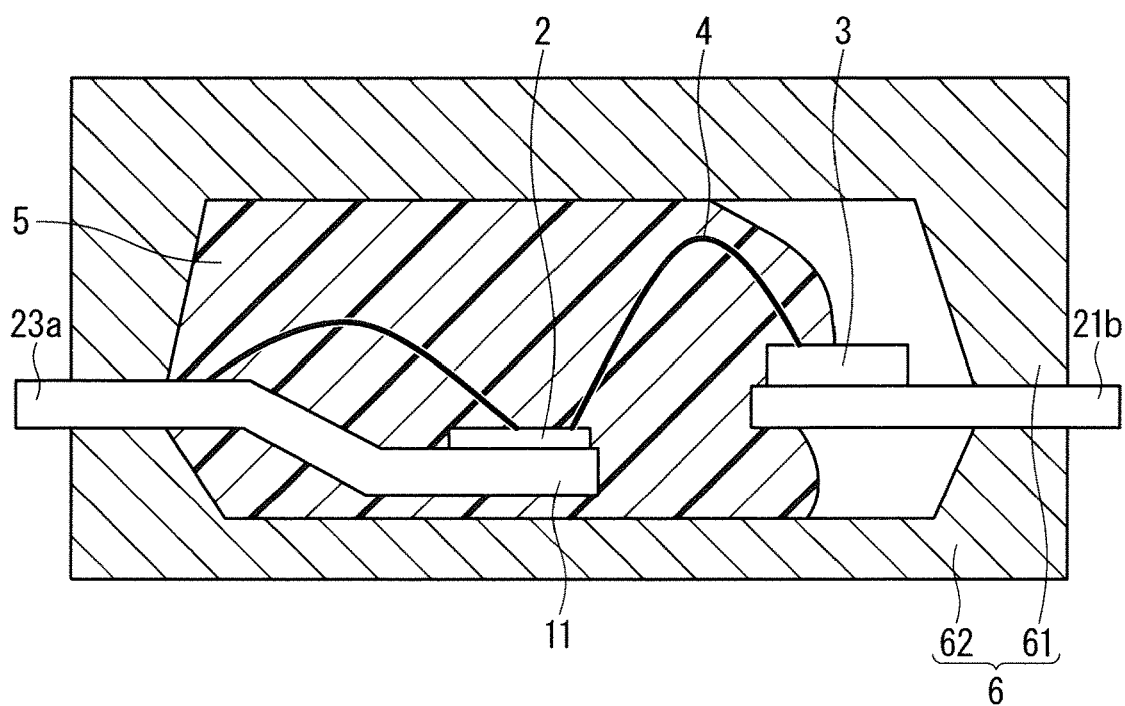
Figure 13:
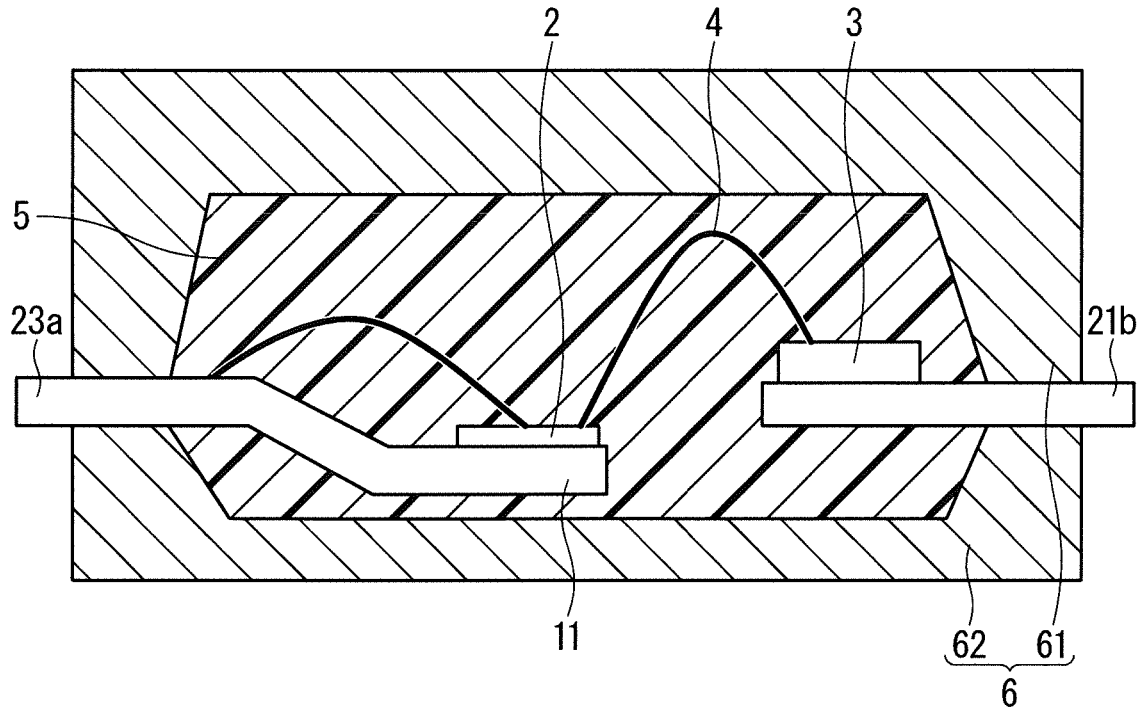

FIGS. 11 to 13 are diagrams showing a method for manufacturing the semiconductor module 103.

First, the lead frame 23, the semiconductor element 2, the driving IC 3, and the metal wire 4 are arranged in the molding die 6 (step S1).

In a state where step S1 is completed, the lead 23a sandwiched by the molding die 6 is flat from a portion outside the cavity 63 to the die stage 11. In particular, a portion positioned inside the cavity 63 in the lead 23a is flat.

Next, as shown in FIG. 11, the sealing material 5 is injected into the cavity 63 of the molding die 6 (step S2).

Since the lead 23a is flat, it is possible to secure a large flow area of the sealing material 5 on the lower side of the die stage 11, and it is possible to reduce the risk of occurrence of an unfilled state of the sealing material 5.

Next, as shown in FIG. 12, the lead 23a is deformed (step S3).

When the temperature of the lead 23a increases and the temperature of the lead 23a exceeds the transformation point of the shape memory alloy included in the lead 23a, the lead 23a is bent, and two bent portions 30 are formed.

The lead 23a may be bent before the injection of the sealing material 5 into the cavity 63 is completed, but it is desirable that the lead 23a be bent after the lower side of the die stage 11 is filled with the sealing material 5. The injection rate of the sealing material 5 is adjusted so that the temperature of the lead 23a exceeds the transformation point after the lower side of the die stage 11 is filled with the sealing material 5.

After the injection of the sealing material 5 is completed and the lead 23a is deformed (see FIG. 13), the sealing material 5 is cured (step S4).

Next, the semiconductor module 103 is released from the molding die 6 (step S5).

The semiconductor module 103 is obtained through the above steps.

In the method for manufacturing a semiconductor module according to the present preferred embodiment, since a pin is unnecessary unlike the case of the first preferred embodiment, the structure of the molding die 6 is simplified. Therefore, the molding die 6 becomes inexpensive, and maintenance of the molding die 6 becomes easy.

In addition, as compared with a nickel-titanium-based alloy widely spread as a shape memory alloy, a copper-zincbased alloy has a specific resistance smaller by one digit, and is suitable for power module applications in which a large current flows.

C-3. Effect

In the semiconductor module 103, the sealing material 5 on the lower side of the die stage 11 is thinner than the sealing material 5 on the upper side of the semiconductor element 2. A bent portion 30 that forms a step with respect to vertical direction in the lead 23a is provided in a region sealed by the sealing material 5 in the lead 23a. Due to the step, a side on which the die stage 11 is present of the step is positioned below a side on which the die stage 11 is not present of the step. The bent portion 30 of the lead 23a contains a shape memory alloy. This makes it possible to suppress occurrence of an unfilled state of the sealing material 5 when sealing is performed with the sealing material 5.

The lead 23a includes a portion of a shape memory alloy, and in the method for manufacturing a semiconductor module according to the present preferred embodiment, the deformation of the lead 23a occurs when the portion of the shape memory alloy of the lead 23a is deformed due to an increase in temperature. Thus, for example, the molding die 6 having a simple structure can be used.

D. Fourth Preferred Embodiment

D-1. Configuration

Figure 14:
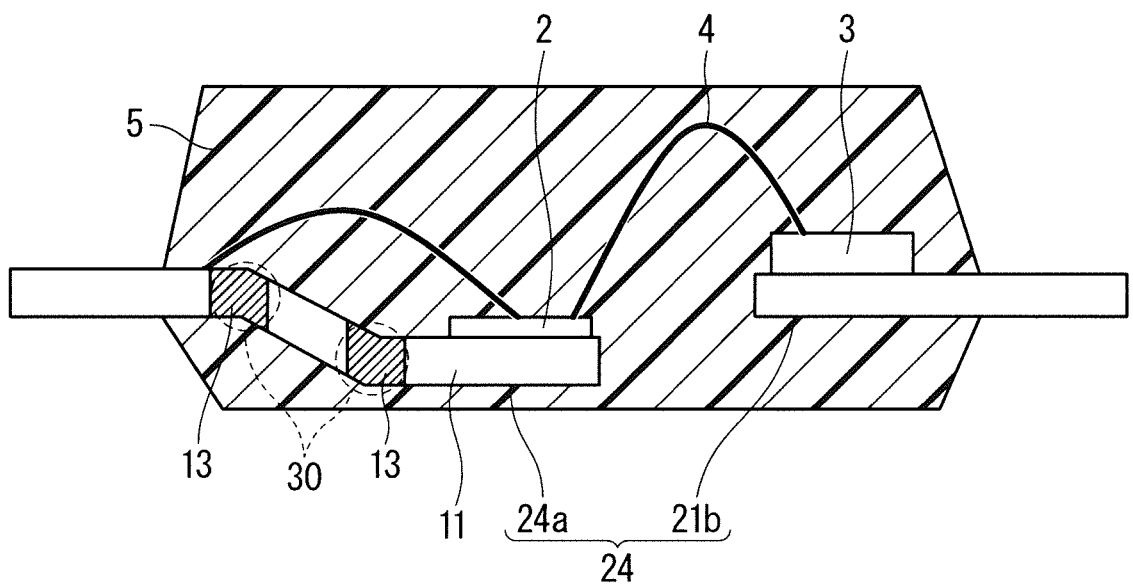
FIG. 14 is a schematic cross-sectional view of a semiconductor module according to a fourth preferred embodiment.

FIG. 14 is a schematic cross-sectional view of a semiconductor module 104 according to a fourth preferred embodiment.

The semiconductor module 104 is different from the semiconductor module 103 of the third preferred embodiment in that a lead frame 24 is included instead of the lead frame 23. The semiconductor module 104 is similar to the semiconductor module 103 in other points.

The lead frame 24 is different from the lead frame 23 in that a lead 24a is included instead of the lead 23a. The lead frame 24 is similar to the lead frame 23 in other points.

The lead 24a is different from the lead 23a in that a shape memory alloy 13 is limitedly used for the two bent portions 30. That is, the portion other than the bent portion 30 in the lead 24a does not contain a shape memory alloy. The lead 24a is similar to the lead 23a in other points. The portion other than the bent portion 30 in the lead 24a contains a metal other than a shape memory alloy. In the lead 24a, the portion other than the shape memory alloy 13 is made of, for example, copper as a material.

In the semiconductor module 104, for example, a copper-zinc-based alloy is used as the shape memory alloy 13. The specific resistance of the copper-zinc-based alloy is one digit larger than that of copper generally employed as a material of the lead frame. In the semiconductor module 104, the energy loss due to resistance can be reduced as compared with that of the third preferred embodiment by localizing the range in which the copper-zinc-based alloy is used.

D-2. Manufacturing Method

FIG. 2 is a flowchart showing a method for manufacturing the semiconductor module 104.

Figure 15:
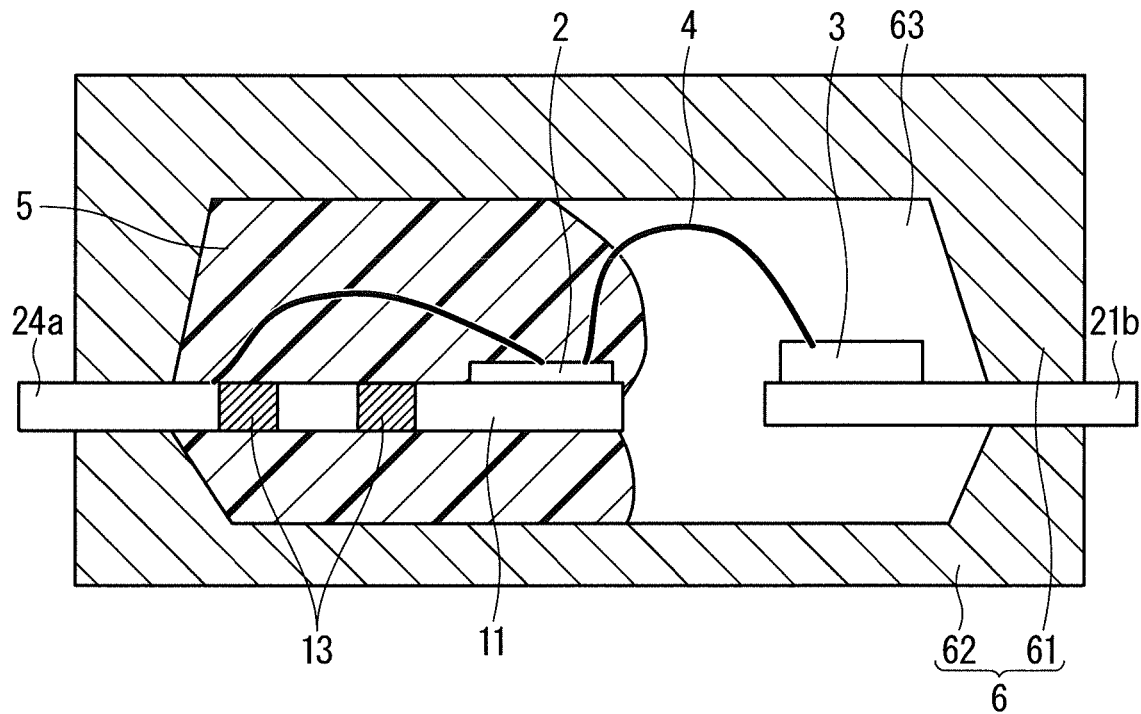
FIGS. 15 to 17 are schematic cross-sectional views each showing a state in the process of manufacturing the semiconductor module of the fourth preferred embodiment.
Figure 16:
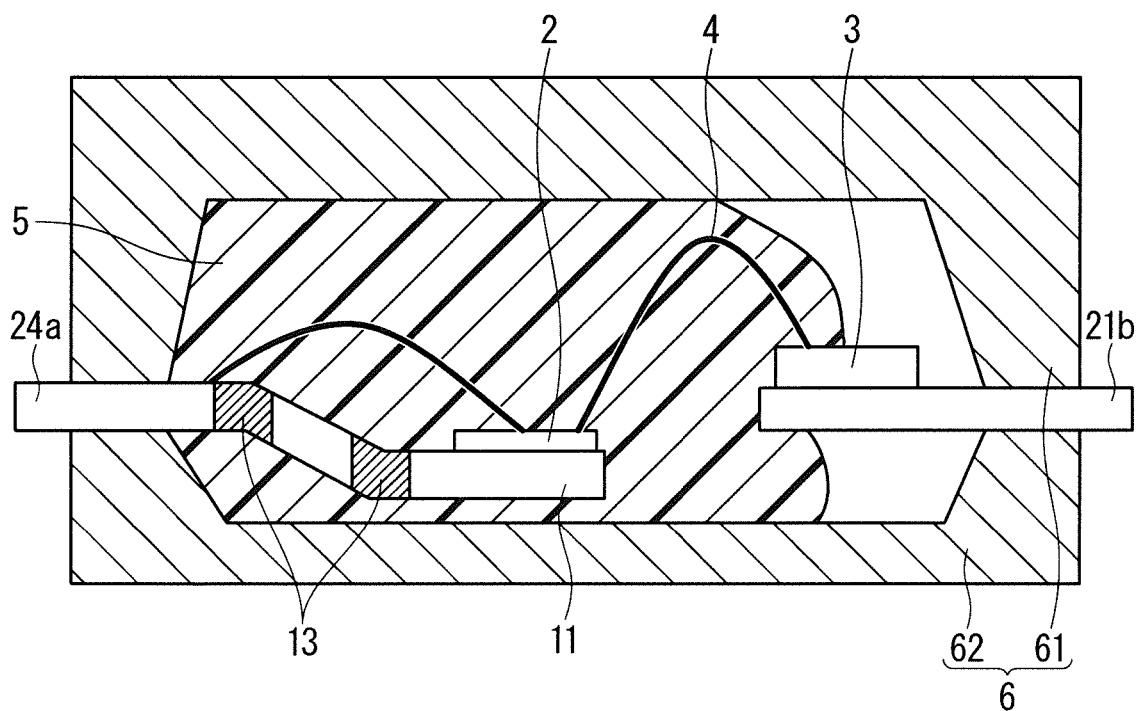
Figure 17:
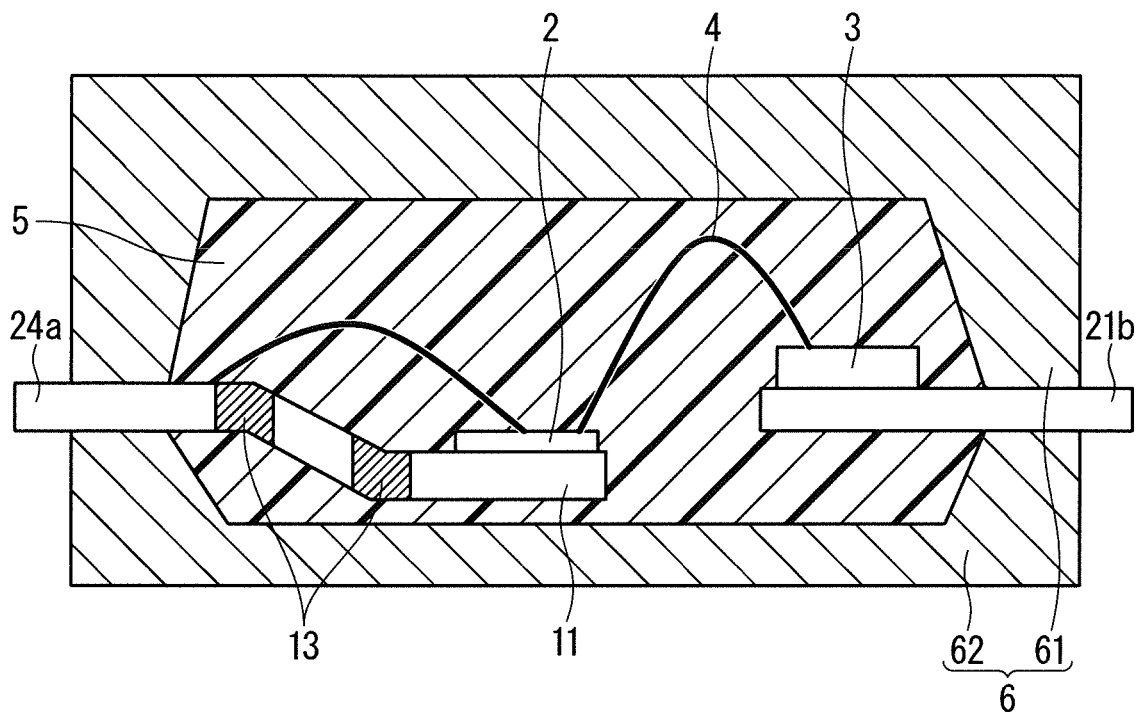

FIGS. 15 to 17 are diagrams showing the method for manufacturing the semiconductor module 104, and respectively correspond to FIGS. 11 to 13 being diagrams showing the method for manufacturing the semiconductor module 103 of the third preferred embodiment. Since the method for manufacturing the semiconductor module 104 is similar to the method for manufacturing the semiconductor module 103 except that the range in which the shape memory alloy is used is different in the lead 23a and the lead 24a, the detailed description of the method for manufacturing the semiconductor module 104 is omitted.

D-3. Effect

The portion other than the bent portion 30 in the lead 24a does not contain a shape memory alloy 13. Thus, energy loss due to resistance can be reduced.

E. Fifth Preferred Embodiment

E-1 Configuration

Figure 18:
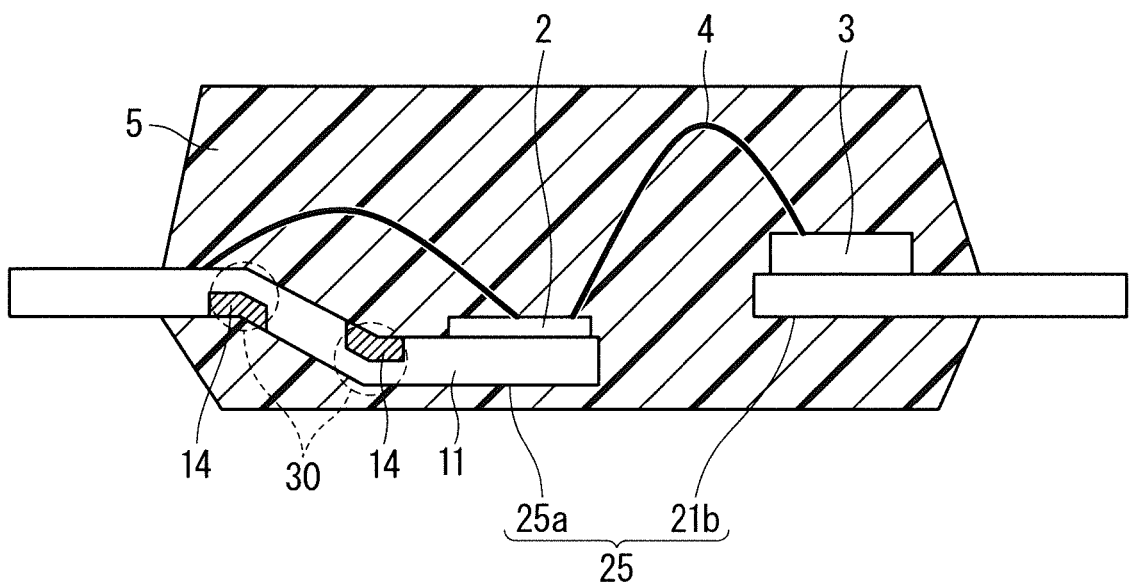
FIG. 18 is a schematic cross-sectional view of a semiconductor module according to a fifth preferred embodiment.

FIG. 18 is a schematic cross-sectional view of a semiconductor module 105 according to a fifth preferred embodiment.

The semiconductor module 105 is different from the semiconductor module 101 of the first preferred embodiment in that a lead frame 25 is included instead of the lead frame 21. The semiconductor module 105 is similar to the semiconductor module 101 in other points.

The lead frame 25 is different from the lead frame 21 in that a lead 25a is included instead of the lead 21a. The lead frame 25 is similar to the lead frame 21 in other points.

In the lead 25a, similarly to the lead 21a, bent portions 30 forming a step are provided at two portions on a side closer to the die stage and a side farther from the die stage 11. In the lead 25a, the two bent portions 30 are not provided with grooves. The shape of the lead 25a is similar to the shape of the lead 21a except that no groove is provided on the surface.

Each of the two bent portions 30 of the lead 25a has a bimetal structure.

The bimetal structure of the bent portion 30 on the side farther from the die stage 11 is a structure in which the linear expansion coefficient of the upper side metal is higher than the linear expansion coefficient of the lower side metal. The bimetal structure of the bent portion 30 on the side closer to the die stage 11 is a structure in which the linear expansion coefficient of the upper side metal is lower than the linear expansion coefficient of the lower side metal.

In the lead 25a, a low linear expansion metal 14 is used on the lower side of the bent portion 30 on the side farther from the die stage 11 and the upper side of the bent portion 30 on the side closer to the die stage 11. The low linear expansion metal 14 is a metal having a linear expansion coefficient lower than that of the metal of the portion other than the low linear expansion metal 14 in the lead 25a.

The metal of the portion other than the low linear expansion metal 14 in the lead 25a is, for example, copper, and the low linear expansion metal 14 is, for example, tungsten. That is, in the bent portion 30 on the side farther from the die stage 11, the upper side metal contains copper, and the lower side metal contains tungsten. In addition, in the bent portion 30 on the side closer to the die stage 11, the upper side metal contains tungsten, and the lower side metal contains copper. In addition, the portion other than the bent portion 30 in the lead 25a contains copper.

E-2. Manufacturing Method

FIG. 2 is a flowchart showing a method for manufacturing the semiconductor module 105.

Figure 20:
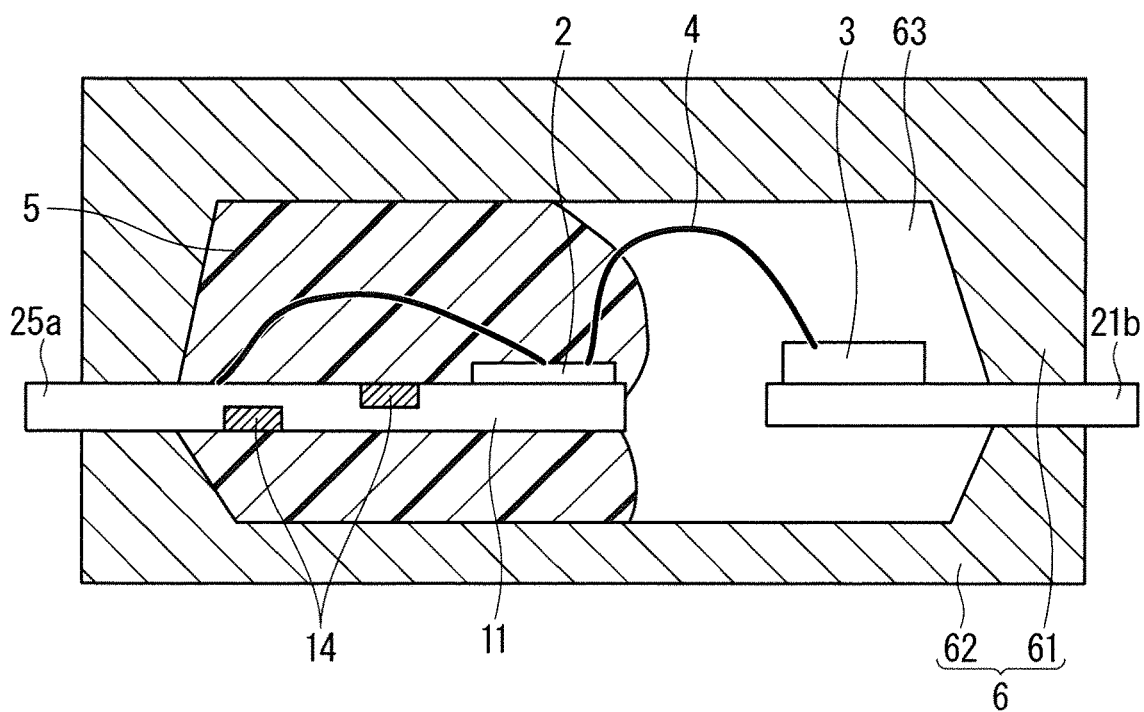
FIGS. 20 to 22 are schematic cross-sectional views each showing a state in the process of manufacturing the semiconductor module of the fifth preferred embodiment.
Figure 21:
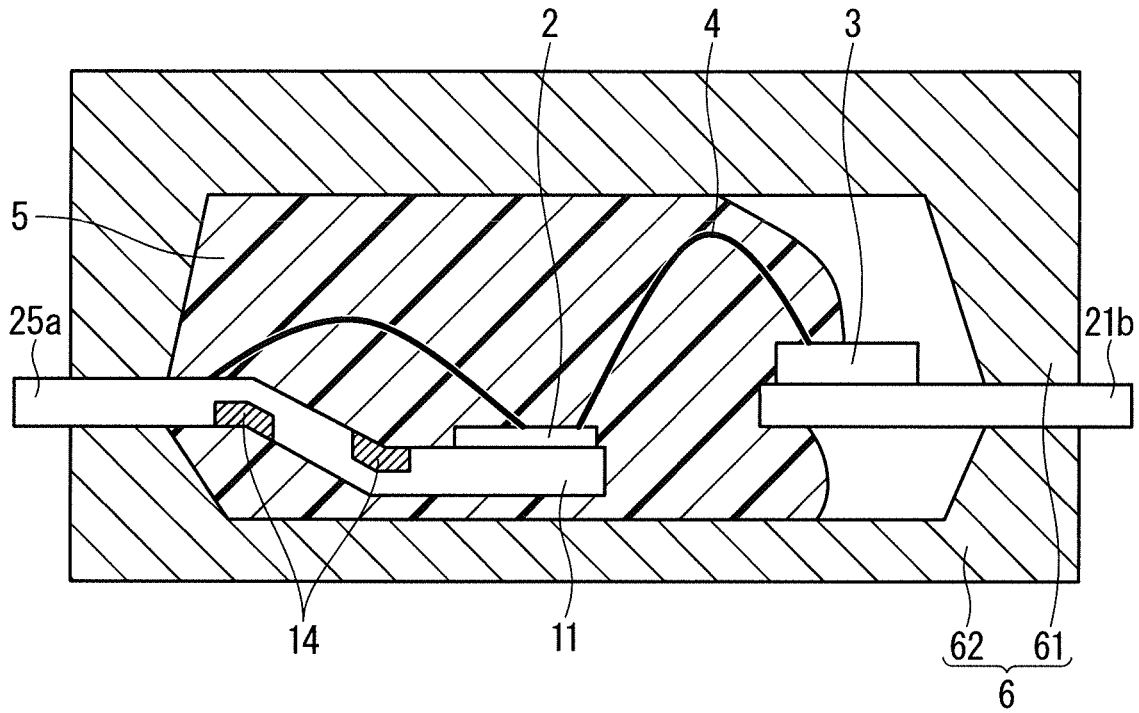
Figure 22:
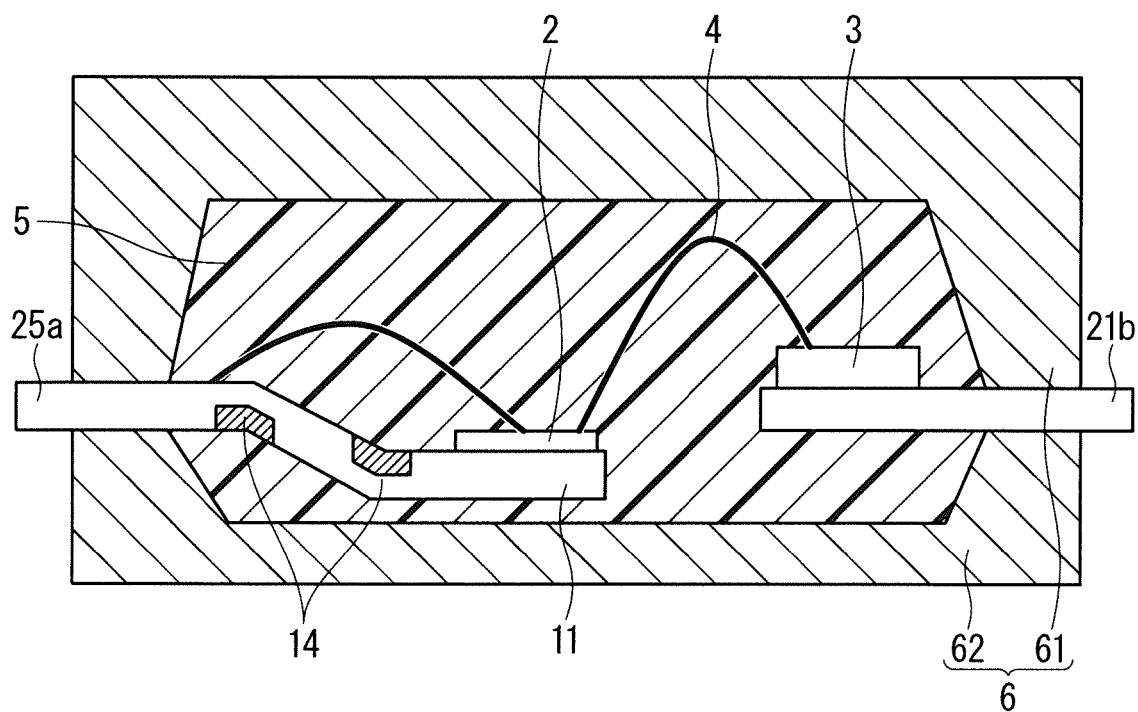

FIGS. 20 to 22 are diagrams showing a method for manufacturing the semiconductor module 105.

First, the lead frame 25, the semiconductor element 2, the driving IC 3, and the metal wire 4 are arranged in the molding die 6 (step S1).

In a state where step S1 is completed, the lead 25a sandwiched by the molding die 6 is flat from a portion outside the cavity 63 to the die stage 11. In particular, a portion positioned inside the cavity 63 in the lead 25a is flat.

Next, as shown in FIG. 20, the sealing material 5 is injected into the cavity 63 of the molding die 6 (step S2).

Next, as shown in FIG. 21, the lead 25a is deformed (step S3).

As the temperature of the lead 25a increases, the lead 25a is bent due to the difference in the degree of linear expansion between the upper and lower metals in the bimetal structure portion, and two bent portions 30 are formed.

The lead 25a may be bent before the injection of the sealing material 5 into the cavity 63 is completed, but the injection rate of the sealing material 5 is adjusted so that a large flow area of the sealing material 5 on the lower side of the die stage 11 is secured before the lower side of the die stage 11 is filled with the sealing material 5.

After the injection of the sealing material 5 is completed and the lead 25a is deformed (see FIG. 22), the sealing material 5 is cured (step S4).

Next, the semiconductor module 105 is released from the molding die 6 (step S5).

The semiconductor module 105 is obtained through the above steps.

In the method for manufacturing a semiconductor module according to the present preferred embodiment, since a pin is unnecessary unlike the case of the first preferred embodiment, the structure of the molding die 6 is simplified. Therefore, the molding die 6 becomes inexpensive, and maintenance of the molding die 6 becomes easy.

Since the range in which the low linear expansion metal 14 is used is localized, an increase in energy loss due to resistance can be suppressed even if the specific resistance of the low linear expansion metal 14 is higher than the specific resistance of the other portion of the lead 25a.

E-3. Modifications

Figure 19:
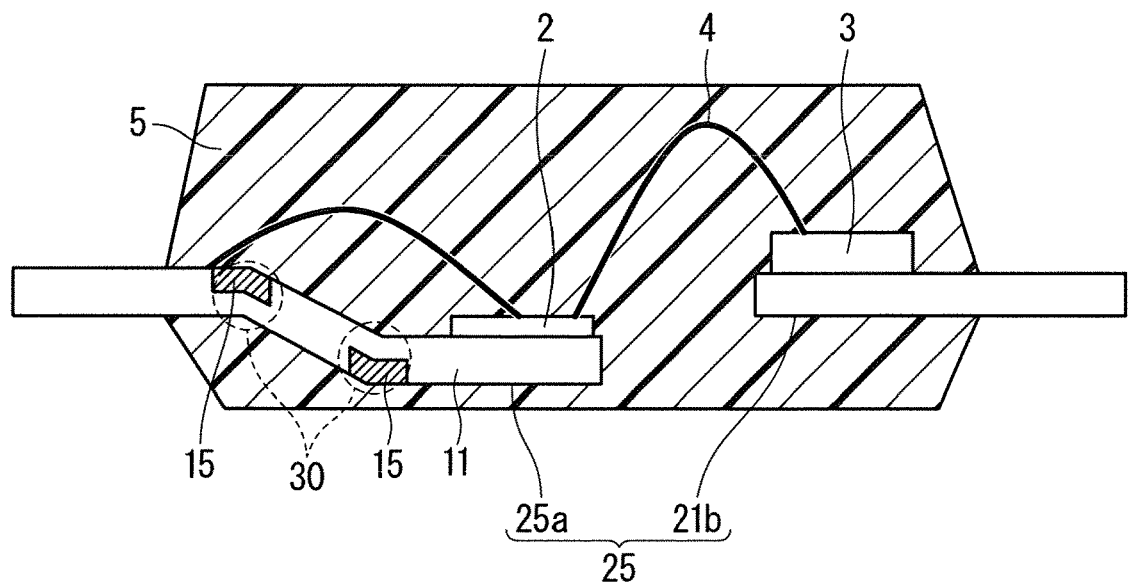
FIG. 19 is a schematic cross-sectional view of a modification of the semiconductor module of the fifth preferred embodiment.

In the semiconductor module 105, the bimetal structure of the lead 25a may be a structure shown in FIG. 19.

In the structure shown in FIG. 19, a high linear expansion metal 15 is used on the upper side of the bent portion 30 on the side farther from the die stage 11 and on the lower side of the bent portion 30 on the side closer to the die stage 11. The high linear expansion metal 15 is a metal having a higher linear expansion coefficient than the metal of the portion other than the high linear expansion metal 15 in the lead 25a.

In the case of the structure shown in FIG. 19, the metal of the portion other than the high linear expansion metal 15 in the lead 25a is, for example, copper, and the high linear expansion metal 15 is, for example, aluminum. That is, in the bent portion 30 on the side farther from the die stage 11, the upper side metal contains aluminum, and the lower side metal contains copper. In addition, in the bent portion 30 on the side closer to the die stage 11, the upper side metal contains copper, and the lower side metal contains aluminum.

As another modification, the semiconductor module 105 may have a structure in which the structure shown in FIG. 18 and the structure shown in FIG. 19 are combined. That is, the low linear expansion metal 14 may be used on the lower side in the bent portion 30 on the side farther from the die stage 11, and the high linear expansion metal 15 may be used on the lower side in the bent portion 30 on the side closer to the die stage 11. In addition, the high linear expansion metal 15 may be used on the upper side in the bent portion 30 on the side farther from the die stage 11, and the low linear expansion metal 14 may be used on the upper side in the bent portion 30 on the side closer to the die stage 11.

As still another modification, the semiconductor module 105 may have a configuration in which the shape memory alloy 13 is used for one bent portion 30 among the two bent portions 30 as described in the fourth preferred embodiment, and the other bent portion 30 has a bimetal structure.

E-4. Effect

In the semiconductor module 105, the sealing material 5 on the lower side of the die stage 11 is thinner than the sealing material 5 on the upper side of the semiconductor element 2. A bent portion 30 that forms a step with respect to vertical direction in the lead 25a is provided in a region sealed by the sealing material 5 in the lead 25a. Due to the step, a side on which the die stage 11 is present of the step is positioned below a side on which the die stage 11 is not present of the step. The bent portion 30 of the lead 25a has a bimetal structure. This makes it possible to suppress occurrence of an unfilled state of the sealing material 5 when sealing is performed with the sealing material 5.

The lead 25a has a portion of a bimetal structure, and in the method for manufacturing a semiconductor module according to the present preferred embodiment, the deformation of the lead 25a occurs when the portion of the bimetal structure of the lead 25a is deformed due to an increase in temperature. Thus, for example, the molding die 6 having a simple structure can be used.

F. Sixth Preferred Embodiment

F-1. Configuration

Figure 23:
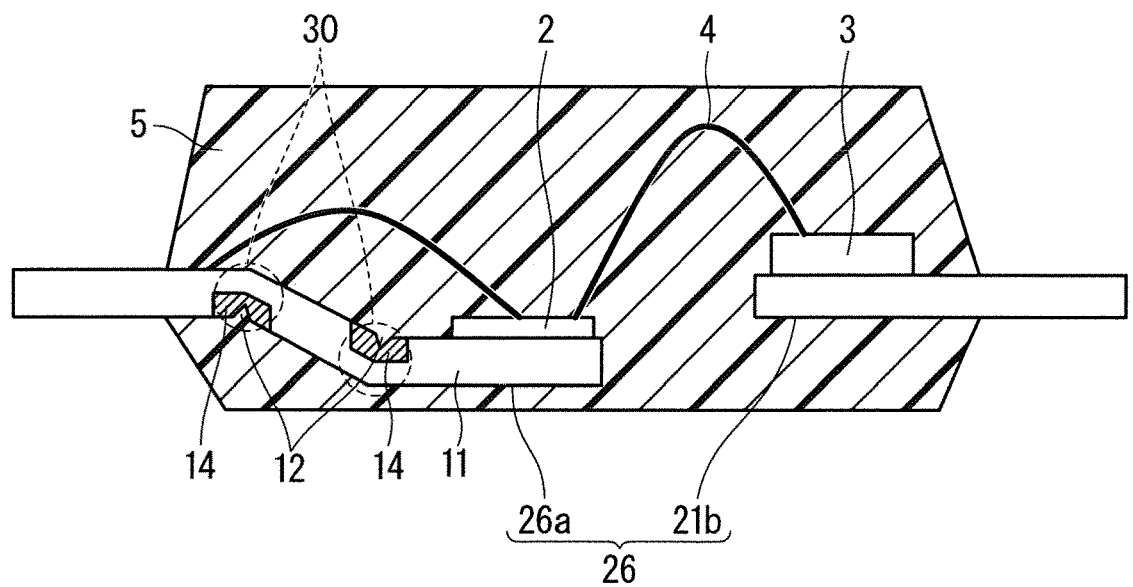
FIG. 23 is a schematic cross-sectional view of a semiconductor module according to a sixth preferred embodiment.

FIG. 23 is a schematic cross-sectional view of a semiconductor module 106 according to a sixth preferred embodiment.

The semiconductor module 106 is different from the semiconductor module 105 of the fifth preferred embodiment in that a lead frame 26 is included instead of the lead frame 25. The semiconductor module 106 is similar to the semiconductor module 105 in other points.

The lead frame 26 is different from the lead frame 25 in that a lead 26a is included instead of the lead 25a. The lead frame 26 is similar to the lead frame 25 in other points.

In the lead 26a, grooves 12 are provided at two bent portions 30. The grooves 12 are provided in the portions of the low linear expansion metal 14, that is, on the lower side of the bent portion 30 on the side farther from the die stage 11 and on the upper side of the bent portion 30 on the side closer to the die stage 11. Adjusting the positions of the grooves 12 allows the positions of the two bent portions 30 to be adjusted. Each of the grooves 12 of the two bent portions 30 is provided so as to extend in a direction intersecting the bending direction of the bent portion 30.

The depth of the groove 12 is desirably designed so that the cross-sectional area of the lead 26a does not become too small in consideration of the density of the current flowing through the lead 26a.

The groove 12 is provided so as to extend in a direction intersecting the bending direction of the bent portion 30.

Even when the high linear expansion metal 15 is used as described in <E-3. Modifications> of the fifth preferred embodiment, the grooves 12 are provided on the lower side surface of the bent portion 30 on the side farther from the die stage 11 and the upper side surface of the bent portion 30 on the side closer to the die stage 11.

F-2. Manufacturing Method

FIG. 2 is a flowchart showing a method for manufacturing the semiconductor module 106.

Figure 24:
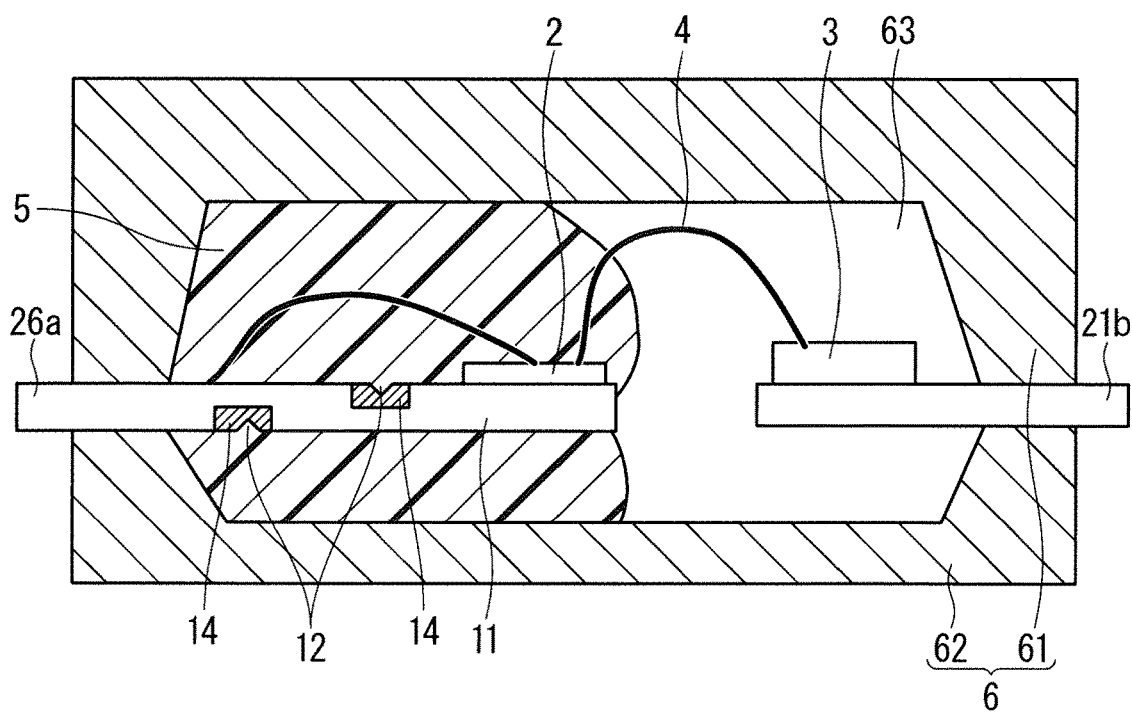
FIGS. 24 to 26 are schematic cross-sectional views each showing a state in the process of manufacturing the semiconductor module of the sixth preferred embodiment.
Figure 25:
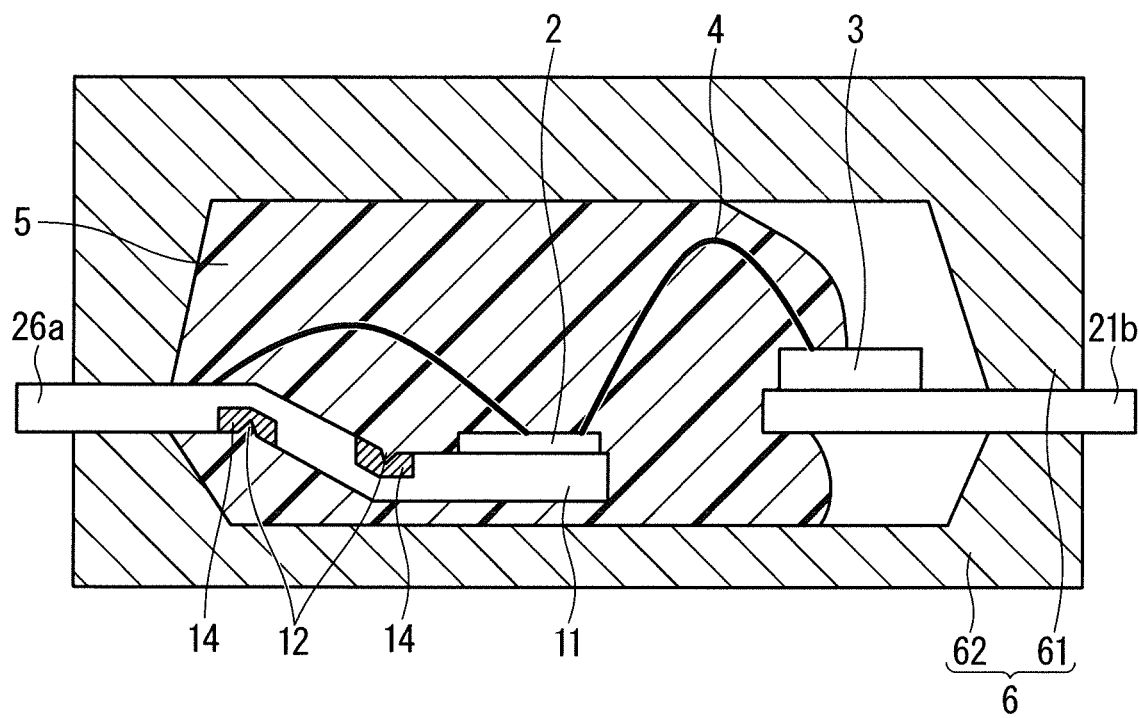
Figure 26:
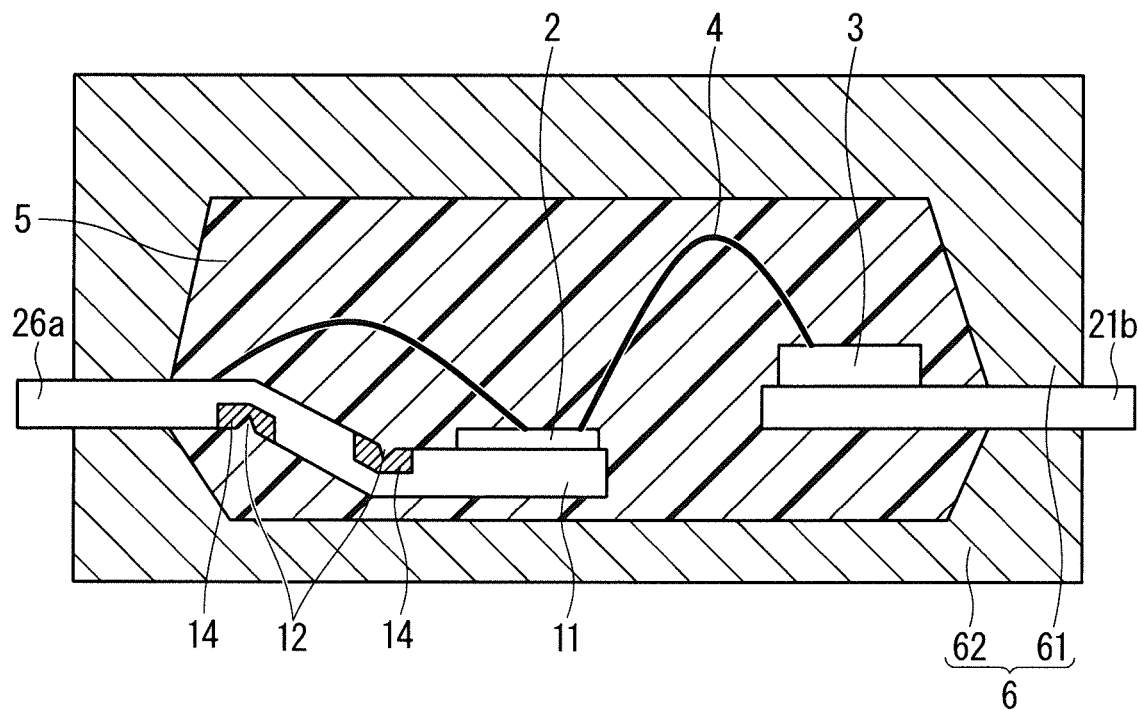

FIGS. 24 to 26 are diagrams showing the method for manufacturing the semiconductor module 106, and respectively correspond to FIGS. 20 to 22 being diagrams showing the method for manufacturing the semiconductor module 105. Since the method for manufacturing the semiconductor module 106 is similar to the method for manufacturing the semiconductor module 105 except that the grooves 12 are provided in the bent portions 30 at two portions in the lead 26a, the detailed description of the method for manufacturing the semiconductor module 106 is omitted.

According to the method for manufacturing a semiconductor module of the present preferred embodiment, the bending of the bent portion 30 can be made sharper and the module size can be made smaller than those of the fifth preferred embodiment.

F-3. Effect

A groove 12 is provided on a lower side surface of the bent portion 30 on a side farther from the die stage 11, and a groove 12 is provided on an upper side surface of the bent portion 30 on a side closer to the die stage 11. Thus, the bending of the bent portion 30 can be made sharper.

G. Comparative Example

Figure 27:
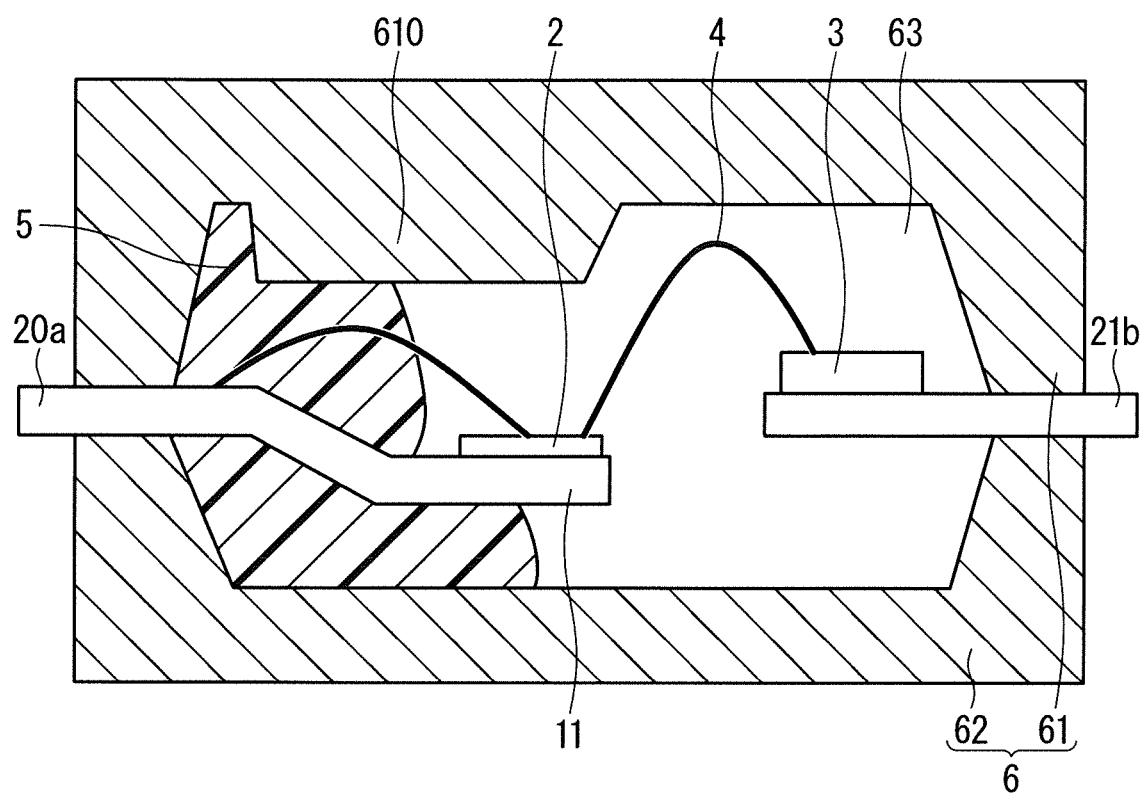
FIG. 27 is a schematic cross-sectional view showing a state in a process of manufacturing a semiconductor module of a comparative example.

As a method for suppressing the occurrence of an unfilled state of the sealing material 5 on the lower side of the die stage 11, as shown in FIG. 27, a method of providing a protruding portion 610 in the cope 61 of the molding die 6, reducing the flow area of the sealing material 5 on the upper side of the lead 20a, and making the sealing material 5 relatively easily flow into the lower side of the die stage 11 is conceivable. The lead 20a used in this method is different from the lead 21a in that the groove 12 is not provided. In addition, in this method, a step is provided in the lead 20a before the injection of the sealing material 5.

However, even if such a method is used, the flow area of the sealing material 5 on the lower side of the lead 20a is determined by the thickness of the sealing material 5 on the lower side of the lead 20a in the completed semiconductor module. The epoxy resin adopted as the sealing material of the power module has high filler filling and high viscosity, and has, for example, viscosity of 5 Pa·s or more. Thus, when the viscosity of the epoxy resin is high and the epoxy resin layer on the lower side of the die stage 11 is thin, particularly when the thickness of the epoxy resin layer on the lower side of the die stage 11 is 0.5 mm or less, the occurrence of an unfilled state cannot be sufficiently suppressed even if the molding die 6 as shown in FIG. 27 is used.

In the first to sixth preferred embodiments, the flow area of the sealing material 5 on the lower side of the lead 21a to the lead 26a is large at the time of injecting the sealing material 5, respectively, so that the sealing material 5 can more easily flow into the lower side of the die stage 11. Therefore, even when the viscosity of the sealing material 5 before curing is 5 Pa·s or more and the thickness of the sealing material 5 on the lower side of the die stage 11 is 0.5 mm or less, occurrence of an unfilled state can be suppressed.

It should be noted that each preferred embodiment can be freely combined, and each preferred embodiment can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor module comprising:
   a first lead;
   a second lead;
   a semiconductor element; and
   a sealing material configured to seal a part of the first lead, a part of the second lead, and the semiconductor element,
   wherein the first lead includes a die stage,
   wherein the semiconductor element is bonded onto an upper side surface of the die stage,
   wherein the sealing material on a lower side of the die stage is thinner than the sealing material on an upper side of the semiconductor element,
   wherein the sealing material on a lower side of the die stage is thinner than the sealing material on a lower side of the second lead,
   wherein a bent portion configured to form a step with respect to vertical direction in the first lead is provided in a region sealed with the sealing material in the first lead,
   wherein a side on which the die stage is present of the step is positioned below a side on which the die stage is not present of the step due to the step,
   wherein a side on which the die stage is not present of the step of the first lead protrudes from one end side of the sealing material,
   wherein the second lead protrudes from a side opposite to the one end side of the sealing material, and
   wherein a groove is provided on an upper side surface, a lower side surface, or both of the upper side surface and the lower side surface of the bent portion of the first lead.

2. The semiconductor module according to claim 1, wherein the bent portion is provided at two portions on a side closer to the die stage and a side farther from the die stage.

3. The semiconductor module according to claim 2, wherein the groove is provided on the upper side surface, the lower side surface, or both of the upper side surface and the lower side surface of the bent portion on a side farther from the die stage.

4. The semiconductor module according to claim 2, wherein the groove is provided on the upper side surface, the lower side surface, or both of the upper side surface and the lower side surface in each of the two bent portions of the first lead.

5. The semiconductor module according to claim 1, wherein the groove is provided to extend in a direction intersecting a bending direction of the bent portion.

6. The semiconductor module according to claim 1,
further comprising a driving IC configured to control driving of the semiconductor module, and
wherein the driving IC is bonded to the second lead.

7. The semiconductor module according to claim 1, wherein a thickness of the sealing material on a lower side of the die stage is 0.5 mm or less.

8. The semiconductor module according to claim 1, wherein the sealing material is an epoxy resin.

9. A semiconductor module comprising:
a first lead;
a semiconductor element; and
a sealing material configured to seal at least a part of the first lead and the semiconductor element,
wherein the first lead includes a die stage,
wherein the semiconductor element is bonded onto an upper side surface of the die stage,
wherein the sealing material on a lower side of the die stage is thinner than the sealing material on an upper side of the semiconductor element,
wherein a bent portion configured to form a step with respect to vertical direction in the first lead is provided in a region sealed with the sealing material in the first lead,
wherein a side on which the die stage is present of the step is positioned below a side on which the die stage is not present of the step due to the step, and
wherein the bent portion of the first lead includes a shape memory alloy deformable from one shape to another upon exceeding a transformation point temperature.

10. The semiconductor module according to claim 9,
wherein the bent portion is provided at two portions on a side closer to the die stage and a side farther from the die stage, and
wherein each of the bent portions at the two portions includes a shape memory alloy.

11. The semiconductor module according to claim 9, wherein the first lead includes a shape memory alloy in a portion other than the bent portion.

12. The semiconductor module according to claim 9, wherein a portion other than the bent portion in the first lead includes a metal other than a shape memory alloy.

13. The semiconductor module according to claim 12, wherein a portion other than the bent portion in the first lead does not contain a shape memory alloy.

14. The semiconductor module according to claim 9, wherein the shape memory alloy is a copper-zinc-based alloy.

15. The semiconductor module according to claim 9,
further comprising a second lead,
wherein a side on which the die stage is not present of the step of the first lead protrudes from one end side of the sealing material, and
wherein the second lead protrudes from a side opposite to the one end side of the sealing material.

16. The semiconductor module according to claim 15,
further comprising a driving IC configured to control driving of the semiconductor module, and
wherein the driving IC is bonded to the second lead.

17. The semiconductor module according to claim 9, wherein a thickness of the sealing material on a lower side of the die stage is 0.5 mm or less.

18. The semiconductor module according to claim 9, wherein the sealing material is an epoxy resin.

19. A semiconductor module comprising:
a first lead;
a semiconductor element; and
a sealing material configured to seal at least a part of the first lead and the semiconductor element,
wherein the first lead includes a die stage,
wherein the semiconductor element is bonded onto an upper side surface of the die stage,
wherein the sealing material on a lower side of the die stage is thinner than the sealing material on an upper side of the semiconductor element,
wherein a bent portion configured to form a step with respect to vertical direction in the first lead is provided in a region sealed with the sealing material in the first lead,
wherein a side on which the die stage is present of the step is positioned below a side on which the die stage is not present of the step due to the step, and
wherein the bent portion of the first lead has a bimetal structure.

20. The semiconductor module according to claim 19,
wherein the bent portion is provided at two portions on a side closer to the die stage and a side farther from the die stage,
wherein each of the bent portions at two portions of the first lead has a bimetal structure,
wherein a bimetal structure of a first bent portion being a side farther from the die stage among the two bent portions is a structure in which a linear expansion coefficient of an upper side metal is higher than a linear expansion coefficient of a lower side metal, and
wherein a bimetal structure of a second bent portion on a side closer to the die stage among the two bent portions is a structure in which a linear expansion coefficient of an upper side metal is lower than a linear expansion coefficient of a lower side metal.

21. The semiconductor module according to claim 20,
wherein the upper side metal of the first bent portion contains aluminum,
wherein the lower side metal of the first bent portion contains copper,
wherein the upper side metal of the second bent portion contains copper, and
wherein the lower side metal of the second bent portion contains aluminum.

22. The semiconductor module according to claim 20,
wherein the upper side metal of the first bent portion contains copper,
wherein the lower side metal of the first bent portion contains tungsten,
wherein the upper side metal of the second bent portion contains tungsten, and
wherein the lower side metal of the second bent portion contains copper.

23. The semiconductor module according to claim 20, wherein a groove is provided on a lower side surface of the first bent portion, and a groove is provided on an upper side surface of the second bent portion.

24. The semiconductor module according to claim 23, wherein the groove is provided to extend in a direction intersecting a bending direction of the bent portion.

25. The semiconductor module according to claim 19, wherein a portion other than the bent portion in the first lead contains copper.

26. The semiconductor module according to claim 19, further comprising a second lead,
wherein a side on which the die stage is not present of the step of the first lead protrudes from one end side of the sealing material, and
wherein the second lead protrudes from a side opposite to the one end side of the sealing material.

27. The semiconductor module according to claim 26, further comprising a driving IC configured to control driving of the semiconductor module, and
wherein the driving IC is bonded to the second lead.

28. The semiconductor module according to claim 19, wherein a thickness of the sealing material on a lower side of the die stage is 0.5 mm or less.

29. The semiconductor module according to claim 19, wherein the sealing material is an epoxy resin.

30. A method for manufacturing a semiconductor module, the semiconductor module including:
a lead including a die stage,
a semiconductor element bonded onto an upper side surface of the die stage, and
a sealing material configured to seal at least a part of the lead and the semiconductor element,
in the semiconductor module, the sealing material on a lower side of the die stage being thinner than the sealing material on an upper side of the semiconductor element,
the method comprising sealing the die stage and the semiconductor element,
wherein the sealing includes injecting the sealing material into a cavity of a mold,
wherein the sealing includes supporting the lead by the mold so that the die stage is positioned inside the cavity, and
wherein the sealing includes, after at least partially injecting the sealing material into the cavity, deforming a portion positioned inside the cavity in the lead to move the die stage downward, and then curing the sealing material.

31. The method for manufacturing a semiconductor module according to claim 30, wherein the deformation of the lead occurs after injection of the sealing material into the cavity is completed and before the sealing material is cured.

32. The method for manufacturing a semiconductor module according to claim 30, wherein moving the die stage downward due to the deformation of the lead causes a thickness of the sealing material on a lower side of the die stage to become half or less of a thickness of the sealing material on a lower side of the die stage when the deformation of the lead is not present.

33. The method for manufacturing a semiconductor module according to claim 30, wherein in the sealing, the lead is flat before injection of the sealing material into the cavity.

34. The method for manufacturing a semiconductor module according to claim 30, wherein the deformation of the lead occurs when an external force from other than the sealing material is applied to a portion positioned inside the cavity in the lead.

35. The method for manufacturing a semiconductor module according to claim 34, wherein the deformation of the lead occurs when the external force is applied to a portion positioned inside the cavity in the lead by a movable pin inserted into the cavity.

36. The method for manufacturing a semiconductor module according to claim 30,
wherein the lead has a portion of a bimetal structure, and
wherein the deformation of the lead occurs when a portion of the bimetal structure is deformed due to an increase in temperature.

37. The method for manufacturing a semiconductor module according to claim 30,
wherein the lead has a portion of a shape memory alloy, and
wherein the deformation of the lead occurs when a portion of the shape memory alloy is deformed due to an increase in temperature.

* * * * *